US012635181B2

(12) United States Patent　　(10) Patent No.: US 12,635,181 B2
Lin et al.　　(45) Date of Patent: May 19, 2026

(54) FIELD EFFECT TRANSISTOR WITH MULTIPLE HYBRID FIN STRUCTURE AND METHOD

(71) Applicant: Taiwan Semiconductor Manufacturing Co., Ltd., Hsinchu (TW)

(72) Inventors: Zhi-Chang Lin, Hsinchu (TW); Chih-Hao Wang, Hsinchu (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 766 days.

(21) Appl. No.: 17/737,915

(22) Filed: May 5, 2022

(65) Prior Publication Data

US 2023/0122250 A1　　Apr. 20, 2023

Related U.S. Application Data

(60) Provisional application No. 63/255,933, filed on Oct. 14, 2021.

(51) Int. Cl.
H10D 30/67 (2025.01)
H10D 62/10 (2025.01)
(Continued)

(52) U.S. Cl.
CPC ....... H10D 30/6735 (2025.01); H10D 62/118 (2025.01); H10D 64/01 (2025.01);
(Continued)

(58) Field of Classification Search
CPC .. H10D 30/6735; H10D 62/118; H10D 64/01; H10D 84/0151; H10D 84/038;
(Continued)

(56) References Cited

U.S. PATENT DOCUMENTS 9,236,267 B2　1/2016　De et al.
9,490,323 B2　11/2016　Rodder et al.
(Continued)

FOREIGN PATENT DOCUMENTS

TW　　202115902 A　4/2021
TW　　202129723 A　8/2021

*Primary Examiner* — Jacob Y Choi
*Assistant Examiner* — Ashley Nicole Blackwell
(74) *Attorney, Agent, or Firm* — Seed IP Law Group

(57) ABSTRACT

A device includes a substrate, first and second gate structures, first and second hybrid fins, and first and second sidewalls. The first gate structure is over and surrounds a first vertical stack of nanostructures. The second gate structure is over and surrounds a second vertical stack of nanostructures. The second gate structure and the first gate structure extend along a first direction, and are laterally separated from each other in a second direction, the second direction being substantially perpendicular to the first direction. The first hybrid fin extends through and under the first gate structure and the second gate structure, the extending being along the second direction. The second hybrid fin is between the first gate structure and the second gate structure.

(Continued)

The second hybrid fin has: a first sidewall that abuts the first gate structure; and a second sidewall that abuts the second gate structure.

20 Claims, 27 Drawing Sheets

(51) Int. Cl.
| | |
|---|---|
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 84/0151* (2025.01); *H10D 84/038* (2025.01); *H10D 84/83* (2025.01)

(58) Field of Classification Search
CPC .. H10D 84/83; H10D 30/6757; H10D 30/797; H10D 30/43; H10D 64/017; H10D 30/014; H10D 62/121; H10D 62/822; H10D 64/666; H10D 84/0135; B82Y 10/00
See application file for complete search history.

(56) References Cited

U.S. PATENT DOCUMENTS

| | | | |
|---|---|---|---|
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 10,049,944 | B2 | 8/2018 | Beasor et al. |
| 2016/0043197 | A1 | 2/2016 | Kim et al. |
| 2019/0067445 | A1* | 2/2019 | Ching .................. H10D 62/116 |
| 2019/0067446 | A1* | 2/2019 | Ching ............... H10D 84/0135 |
| 2019/0355720 | A1* | 11/2019 | Deng .................. H10D 84/038 |
| 2020/0020783 | A1 | 1/2020 | Zhou |
| 2020/0135932 | A1* | 4/2020 | Wang .................. H10D 64/021 |
| 2021/0343713 | A1* | 11/2021 | Ju ..................... H01L 21/28123 |
| 2022/0037498 | A1* | 2/2022 | Lin .................. H01L 21/02532 |

* cited by examiner

1000

1100 Form isolated fin lattice structures

1200 Form first hybrid fin

1300 Form sacrificial gate structures

1400 Form second hybrid fins

1500 Form source/drain regions

1600 Form replacement gate structures

FIELD EFFECT TRANSISTOR WITH MULTIPLE HYBRID FIN STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
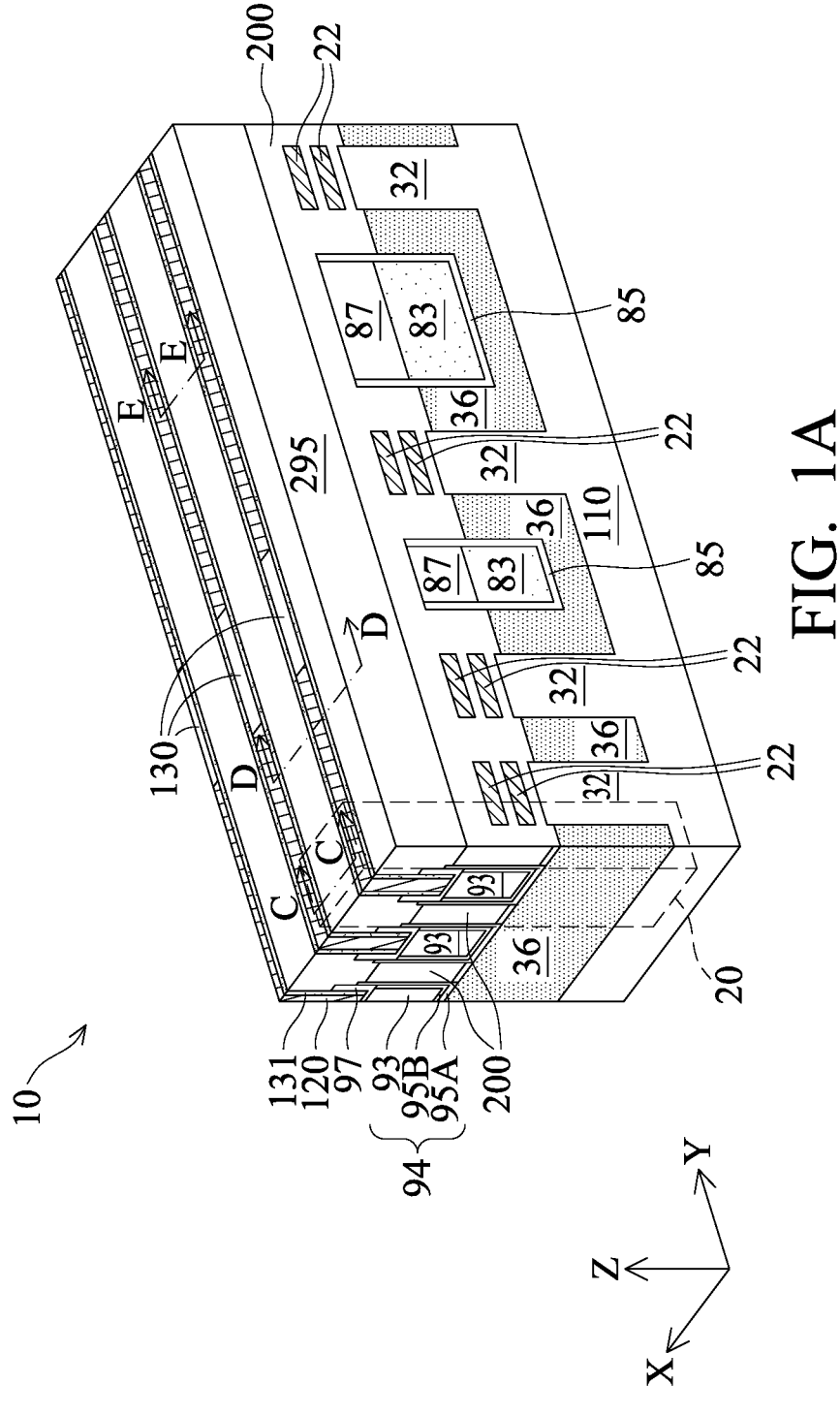
FIGS. 1A-1E are diagrammatic perspective and cross-sectional side views of a portion of an IC device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Such terms may be process- and/or equipment-dependent, and should not be interpreted as more or less limiting than a person having ordinary skill in the art would recognize as normal for the technology under discussion.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, dimension scaling can lead to difficulties forming features of the semiconductor devices. As active area ("oxide Definition" (OD)) spacing shrinks in nanoscale process nodes, inclusion of hybrid fins is beneficial to avoid bridging of source/drain epitaxial regions. The hybrid fins introduce metal gate gap fill degradation due to small spacing between channel regions and the hybrid fins.

Embodiments of the present disclosure include two types of hybrid fins. The first type of hybrid fins are formed between stacks of the channel layers having larger spacing therebetween, and extend through both the metal gate (MG) region and the source/drain epitaxial regions. The second type of hybrid fins are formed between the source/drain epitaxial regions but not in the metal gate regions. The second type of hybrid fins are formed between the source/drain epitaxial regions to prevent merging of adjacent source/drain epitaxial regions. Because the second type of hybrid fin is not formed in the metal gate regions, space for forming the metal gate is increased, which improves yield.

Nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

Figure 1B:
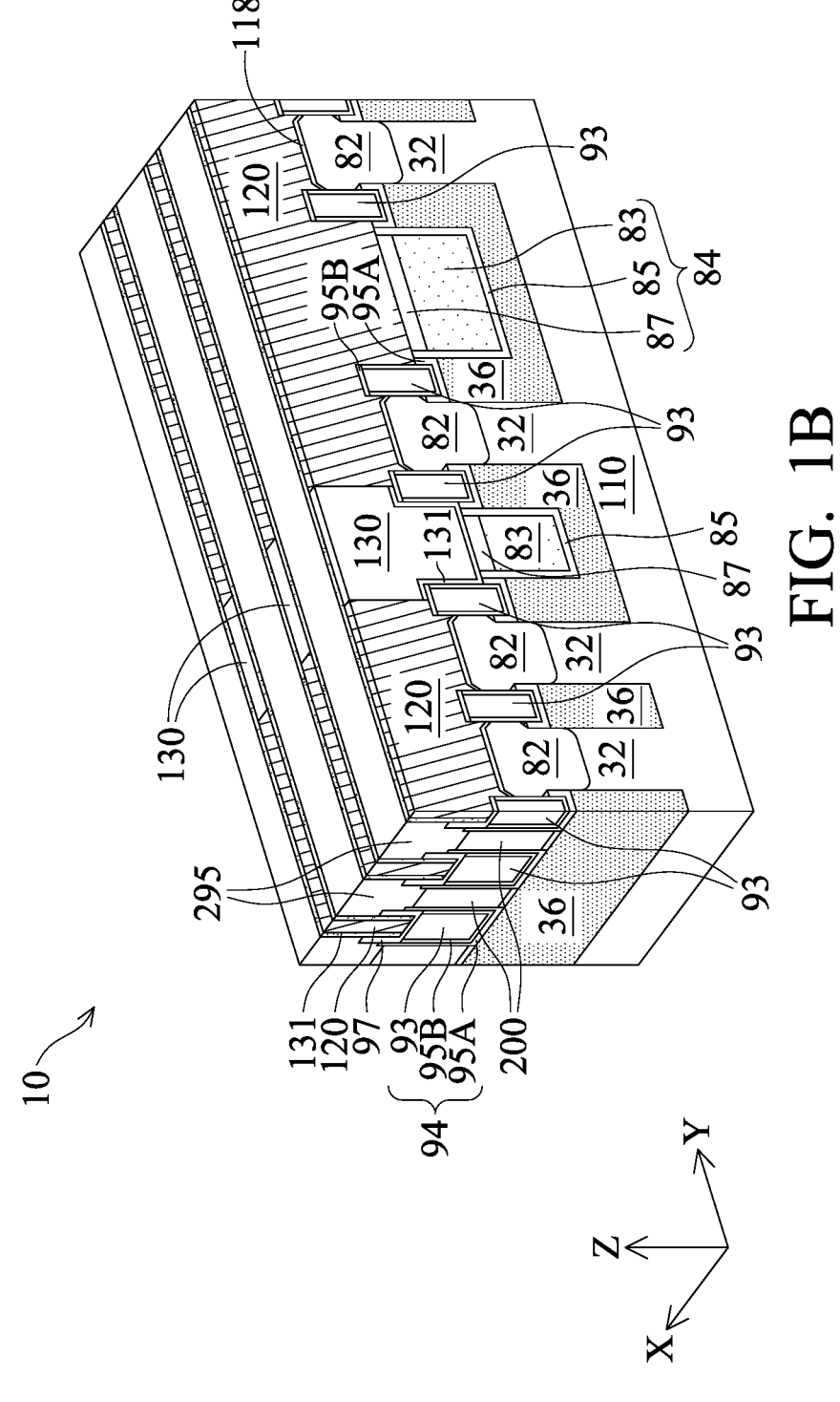
Figures 1C, 1D:
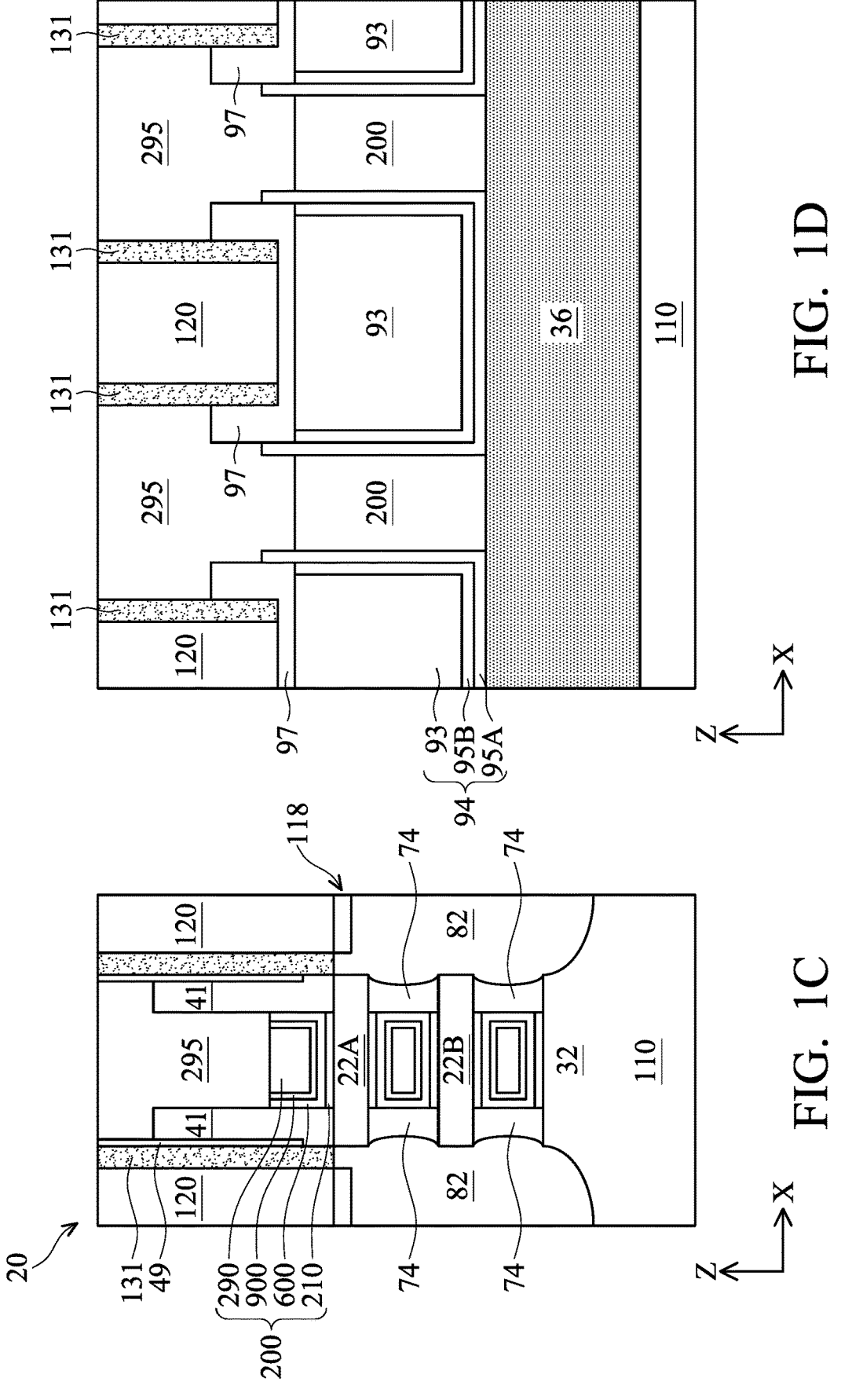
Figure 1E:
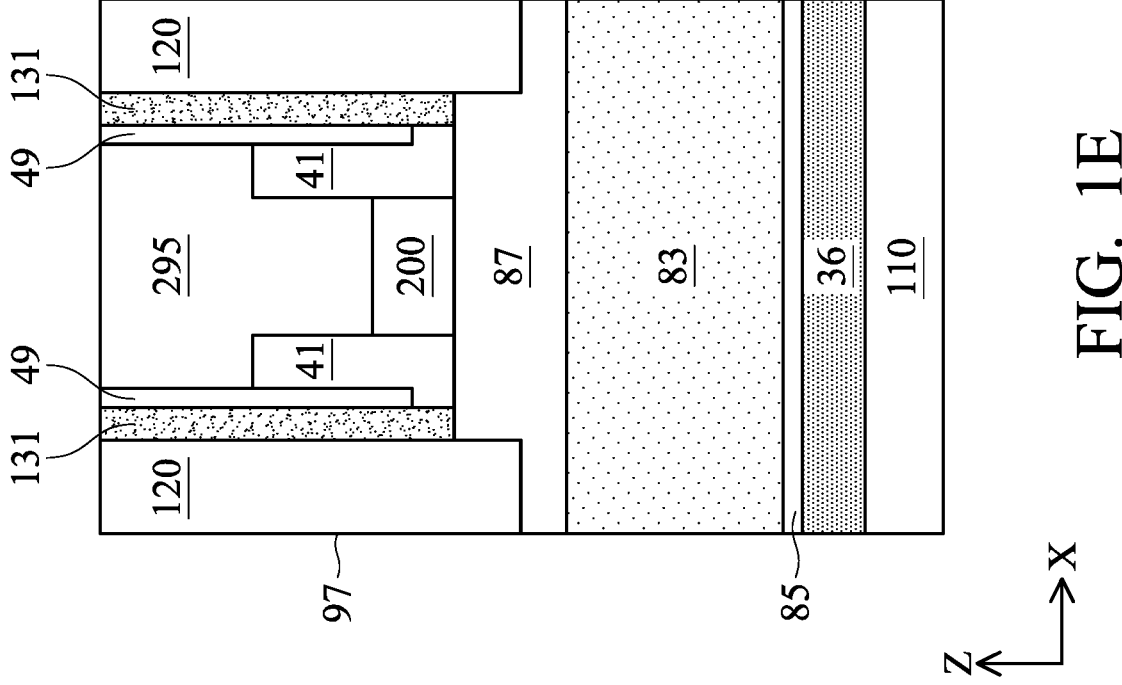

FIGS. 1A-1E illustrate diagrammatic perspective and cross-sectional side views of a portion of an IC device 10 fabricated according to embodiments of the present disclosure, where the IC device 10 includes nanostructure devices, such as gate-all-around (GAA) devices. FIGS. 1A, 1B are diagrammatic perspective views of the portion of the IC device 10. FIG. 1C is a cross-sectional side view of a portion of the IC device 10 along the line C-C shown in FIG. 1A. FIG. 1D is a cross-sectional side view of a portion of the IC device 10 along the line D-D shown in FIG. 1A. FIG. 1E is a cross-sectional side view of a portion of the IC device 10 along the line E-E shown in FIG. 1A. Certain features may be removed from view the perspective views of FIGS. 1A, 1B for simplicity of illustration.

Nanostructure devices 20 may include at least an N-type FET (NFET) or a P-type FET (PFET) in some embodiments. A single nanostructure device 20 is highlighted in FIG. 1A in phantom, and is shown in cross-sectional side view in FIG. 1C. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

Referring to FIGS. 1A-1C, the nanostructure device 20 (see FIG. 1C) is formed over and/or in a substrate 110, and generally includes gate structure 200 straddling and/or wrapping around semiconductor channels 22, alternately referred to as "nanostructures," located over semiconductor fin 32 protruding from, and separated by, isolation structures 36. The gate structure 200 controls electrical current flow through the channels 22.

Referring to FIG. 1C, the cross-sectional view of the IC device 10 is taken along an X-Z plane, where the X-axis direction is the horizontal direction, and the Z-axis direction is the vertical direction. The cross-sectional view in FIG. 1C shows the nanostructure device 20, and the related description is generally applicable to other nanostructure devices of the IC device 10. In FIG. 1C, the nanostructure device 20 is shown including two channels 22A, 22B, which are laterally abutted by source/drain features 82, and covered and surrounded by the gate structure 200. Generally, the number of channels 22 is two (as shown in FIG. 1D) or more than two, such as three (FIG. 1C) or four or more. The gate structure 200 controls flow of electrical current through the channels 22A, 22B to and from the source/drain features 82 based on voltages applied at the gate structure 200 and at the source/drain features 82. The channel 22B is nearer the substrate 110 than the channel 22A. The channel 22A may be referred to as a topmost channel 22A, and may be the channel 22A most distal the substrate 110 in a stack of channels 22. The channel 22B (in the case of two channels) may be referred to as a bottommost channel 22B, and may be the channel 22B most proximal the substrate 110 in the stack of channels 22. The channel 22B is between the channel 22A and the substrate 110.

In some embodiments, the fin structure 32 includes silicon. In some embodiments, the nanostructure device 20 is an NFET, and the source/drain features 82 thereof include silicon phosphorous (SiP). In some embodiments, the nanostructure device 20 is a PFET, and the source/drain features 82 thereof include silicon germanium (SiGe). It should be appreciated that a number of semiconductive materials are suitable for the source/drain features 82, and N-type or P-type may be determined based on a base semiconductive material of the source/drain feature 82, based on a dopant type, based on a dopant concentration, or based on a combination thereof.

The channels 22A, 22B each include a semiconductive material, for example silicon or a silicon compound, such as silicon germanium, or the like. The channels 22A, 22B are nanostructures (e.g., having sizes that are in a range of a few nanometers) and may also each have an elongated shape and extend in the X-direction. In some embodiments, the channels 22A, 22B each have a nano-wire (NW) shape, a nano-sheet (NS) shape, a nano-tube (NT) shape, or other suitable nanoscale shape. The cross-sectional profile of the channels 22A, 22B may be rectangular, round, square, circular, elliptical, hexagonal, or combinations thereof.

In some embodiments, the lengths (e.g., measured in the X-direction) of the channels 22A, 22B may be different from each other, for example due to tapering during a fin etching process. In some embodiments, length of the channel 22A may be less than a length of the channel 22B. The channels 22A, 22B each may not have uniform thickness, for example due to a channel trimming process used to expand spacing (e.g., measured in the Z-direction) between the channels 22A, 22B to increase gate structure fabrication process window. For example, a middle portion of each of the channels 22A, 22B may be thinner than the two ends of each of the channels 22A, 22B. Such shape may be collectively referred to as a "dog-bone" shape.

In some embodiments, the spacing between the channels 22A, 22B is in a range of about 8 nanometers (nm) to about 12 nm. In some embodiments, a thickness (e.g., measured in the Z-direction) of each of the channels 22A, 22B is in a range of about 5 nm to about 8 nm. In some embodiments, a width (e.g., measured in the Y-direction, not shown in FIG. 1C, orthogonal to the X-Z plane) of each of the channels 22A, 22B is at least about 8 nm.

The gate structure 200 is disposed over and between the channels 22A, 22B, respectively, and further between the bottommost channel 22B and the fin structure 32, which is shown in FIG. 1C. In some embodiments, the gate structure 200 is disposed over and between the channels 22A, 22B, which may be silicon channels for N-type devices or silicon germanium channels for P-type devices. In some embodiments, the gate structure 200 includes an interfacial layer (IL) 210, one or more gate dielectric layers 600, one or more work function tuning layers 900, and a metal fill layer 290.

The interfacial layer 210, which may be an oxide of the material of the channels 22A, 22B (e.g., silicon oxide), is formed on exposed areas of the channels 22A, 22B and the top surface of the fin 32. The interfacial layer 210 promotes adhesion of the gate dielectric layers 600 to the channels 22A, 22B. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the nanostructure device 20 may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal fill layer 290. The metal fill layer 290 may include a conductive material such as tungsten, cobalt, ruthenium, iridium, molybdenum, copper, aluminum, or combinations thereof. Between the channels 22A, 22B, the metal fill layer 290 is circumferentially surrounded (in the cross-sectional view) by the one or more work function metal layers 900, which are then circumferentially surrounded by the gate dielectric layers 600. The gate structure 200 may also include a glue layer that is formed between the one or more work function layers 900 and the metal fill layer 290 to increase adhesion. The glue layer is not specifically illustrated in FIGS. 1A-1E for simplicity.

The nanostructure device 20 may also include gate spacers 41 and inner spacers 74 that are disposed on sidewalls of the gate dielectric layer 600 and the IL 210. The inner spacers 74 are also disposed between the channels 22A, 22B. The gate spacers 41 and the inner spacers 74 may include a dielectric material, for example a low-k material such as SiOCN, SiON, SiN, or SiOC. In some embodiments, one or more additional spacer layers 49 are present abutting the gate spacers 41, as shown in FIG. 1C.

The nanostructure device 20 may further include source/drain contacts 120 that are formed over the source/drain features 82. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 includes nickel, cobalt, titanium, tantalum, platinum, tungsten, other noble metals, other refractory metals, rare earth metals or their alloys. In some embodiments, thickness of the silicide layer 118 (in the Z direction) is in a range of about 0.5 nm to about 5 nm. In some embodiments, height of the source/drain contacts 120 may be in a range of about 1 nm to about 50 nm.

As shown in FIG. 1B, one or more of the source/drain contacts 120 may each overlie multiple nanostructure devices along the Y-axis direction. In some embodiments, others of the source/drain contacts 120, may each overlie a single nanostructure device along the Y-direction.

In some embodiments, as shown in FIG. 1B, each of the source/drain regions 82 is formed over a respective fin 32, and is separated from others of the source/drain regions 82 by hybrid fins 94 (or "inactive fins 94" or "second hybrid fins 94") formed over isolation regions 36. In some embodiments, the isolation regions 36 are shallow trench isolation ("STI") regions. In some embodiments, each of the hybrid fins 94 includes a liner layer 95 (or "dielectric layer 95") and a fill layer 93 (or "oxide layer 93" or "core layer 93"). Hybrid fins 94 are separated from each other along the X-axis direction by the gate structures 200. As described with reference to FIGS. 2-20, the hybrid fins 94 do not extend through the gate structures 200, which improves formation of the gate structures 200 between the channels 22 and the source/drain regions 82, as can be seen in FIG. 1A. In some embodiments, upper surfaces of the second hybrid fins 94 extend above upper surfaces of the source/drain regions 82 in the Z-axis direction by a distance in a range of about 2 nm to about 20 nm. Below about 2 nm, the second hybrid fins 94 may not be high enough to prevent merger of neighboring source/drain regions 82.

The liner layer 95 may include a first liner layer 95A and a second liner layer 95B. The first liner layer 95A and the second liner layer 95B may include a low-k dielectric layer comprising, SiN, SiCN, SiOCN, SiOC, or the like. In some embodiments, the first liner layer 95A and the second liner layer 95B include the same or substantially the same material, such as SiCON. In some embodiments, the first liner layer 95A and the second liner layer 95B include different materials. For example, the first liner layer 95A may include SiCON and the second liner layer 95B may include SiN. Each of the first liner layer 95A and the second liner layer 95B may have thickness in a range of about 2 nm to about 5 nm.

The fill layer 93 may include a low-k dielectric material that is different from that (or those) of the first and second liner layers 95A, 95B. In some embodiments, the fill layer 93 includes SiN, silicon oxide, or another similar material. Generally, the fill layer 93 has different etch selectivity than the second liner layer 95B, so that the fill layer 93 may be recessed without substantially attacking the second liner layer 95B. Height of the fill layer 93 may be in a range of about 10 nm to about 60 nm. A top surface of the liner layer 93 may be above (e.g., further from the substrate 110) the top of the uppermost nanostructure 22A by about 0 nm (e.g., coplanar) to about 20 nm.

The first hybrid fins 84 are formed in and over the isolation regions 36, as shown in FIGS. 1A, 1B. The first hybrid fins 84 include a liner layer 85, a fill layer 83 (or "core layer 83"), and a capping layer 87, and may extend through the gate structures 200 in the X-axis direction.

The liner layer 85 may include a low-k dielectric layer comprising, SiN, SiCN, SiOCN, SiOC, or the like. In some embodiments, the liner layer 85 is or includes SiCN. The liner layer 85 may have thickness in a range of about 2 nm to about 10 nm. The material of the liner layer 85 has different etch selectivity than the isolation regions 36 and the fill layer 83. Thickness of the isolation region 36 underlying the liner layer 85 may be in a range of about 10 nm to about 40 nm.

The fill layer 83 may include a low-k dielectric material that is different from that of the liner layer 85. In some embodiments, the fill layer 83 includes silicon oxide, such as silicon oxide deposited by, for example, flowable CVD (FCVD), or another similar material. The fill layer 83 has different etch selectivity than the liner layer 85, so that the fill layer 83 may be recessed without substantially attacking the liner layer 85. Width of the fill layer 83 is generally greater than about 10 nm, though may be less than 10 nm in some embodiments. Height of the fill layer 83 may be in a range of about 10 nm to about 150 nm. Spacing between the fill layer 83 and neighboring fins 32 or nanostructures 22 is in a range of about 20 nm to about 30 nm. Below about 20 nm, the spacing is insufficient for formation of the gate structures 200 without voids or other defects.

The capping layer 87 may include a low-k dielectric material that is different from that of the fill layer 83. The material of the capping layer 87 may be the same or substantially the same as the material of the liner layer 85. For example, the capping layer 87 and the liner layer 85 may be SiCN. In some embodiments, the capping layer 87 includes SiCN, SiCON, SiN, or another suitable material. Generally, the capping layer 87 has different etch selectivity than the fill layer 83. Height of the capping layer (e.g., in the Z-axis direction) may be in a range of about 5 nm to about 50 nm.

It should be appreciated that the first hybrid fins 84, which extend through and under the gate structures 200 are generally closer in the Z-axis direction to the substrate 110 than the second hybrid fins 94, which do not extend through the gate structures 200, but are present between the gate structures 200 on top of the isolation structures 36. The first hybrid fins 84 extend downward in the Z-axis direction into the isolation structures 36. As such, lower surfaces of the first hybrid fins 84 may be nearer the substrate 110 than lower surfaces of the second hybrid fins 94 by a dimension in a range of about 10 nm to about 150 nm.

Source/drain contact isolation structures (not illustrated in the figures) may extend from an upper surface of a respective hybrid fin 94 to at least upper surfaces of the source/drain contacts 120 abutting either side of the source/drain contact isolation structure, such that the source/drain contact isolation structure completely electrically isolates the source/drain contact 120 on a first side of the source/drain contact isolation structure from the source/drain contact 120 on a second opposite side of the source/drain contact isolation structure.

Again to FIG. 1B, certain of the nanostructure devices 20 further include an interlayer dielectric (ILD) 130. The ILD 130 provides electrical isolation between the various components of the nanostructure devices 20 discussed above, for example between source/drain contacts 120. An etch stop layer 131 may be formed prior to forming the ILD 130, and may be positioned laterally between the gate spacers 41 and the ILD 130 or the source/drain contacts 120, and vertically between the ILD 130 and the source/drain features 82. In some embodiments, the etch stop layer 131 is or includes SiN, SiCN, SiC, SiOC, SiOCN, $HfO_2$, $ZrO_2$, $ZrAlO_x$, $HfAlO_x$, $HfSiO_x$, $Al_2O_3$, or other suitable material. In some embodiments, thickness of the etch stop layer 131 is in a range of about 1 nm to about 5 nm.

As shown in FIGS. 1A, the gate structures 200B-200E may straddle the first hybrid fins 84 to form interconnection between transistors on either side of the first hybrid fins 84. In some embodiments, one or more of the gate structures 200, may be rendered discontinuous (e.g., along the Y-axis direction) by a gate isolation structure (not illustrated) overlying the first hybrid fin 84. In some embodiments, the gate isolation structure is or includes one or more dielectric materials, such as a high-k liner layer and a low-k fill layer.

FIG. 1D is a cross-sectional side view of a portion of the IC device 10 along the line D-D shown in FIG. 1A. In some embodiments, a capping layer 97 overlies the fill layer 93 and the second liner layer 95B. The capping layer 97 may extend upward in the Z-axis direction, such that the source/drain contacts 120 and the optional etch stop layer 131 are between vertical extensions of the capping layer 97. In some embodiments, the capping layer 97 has height in the Z-axis direction in a range of about 10 nm to about 30 nm, and the vertical extensions of the capping layer 97 have thickness in the X-axis direction of 0 nm to about 10 nm.

Figure 20:
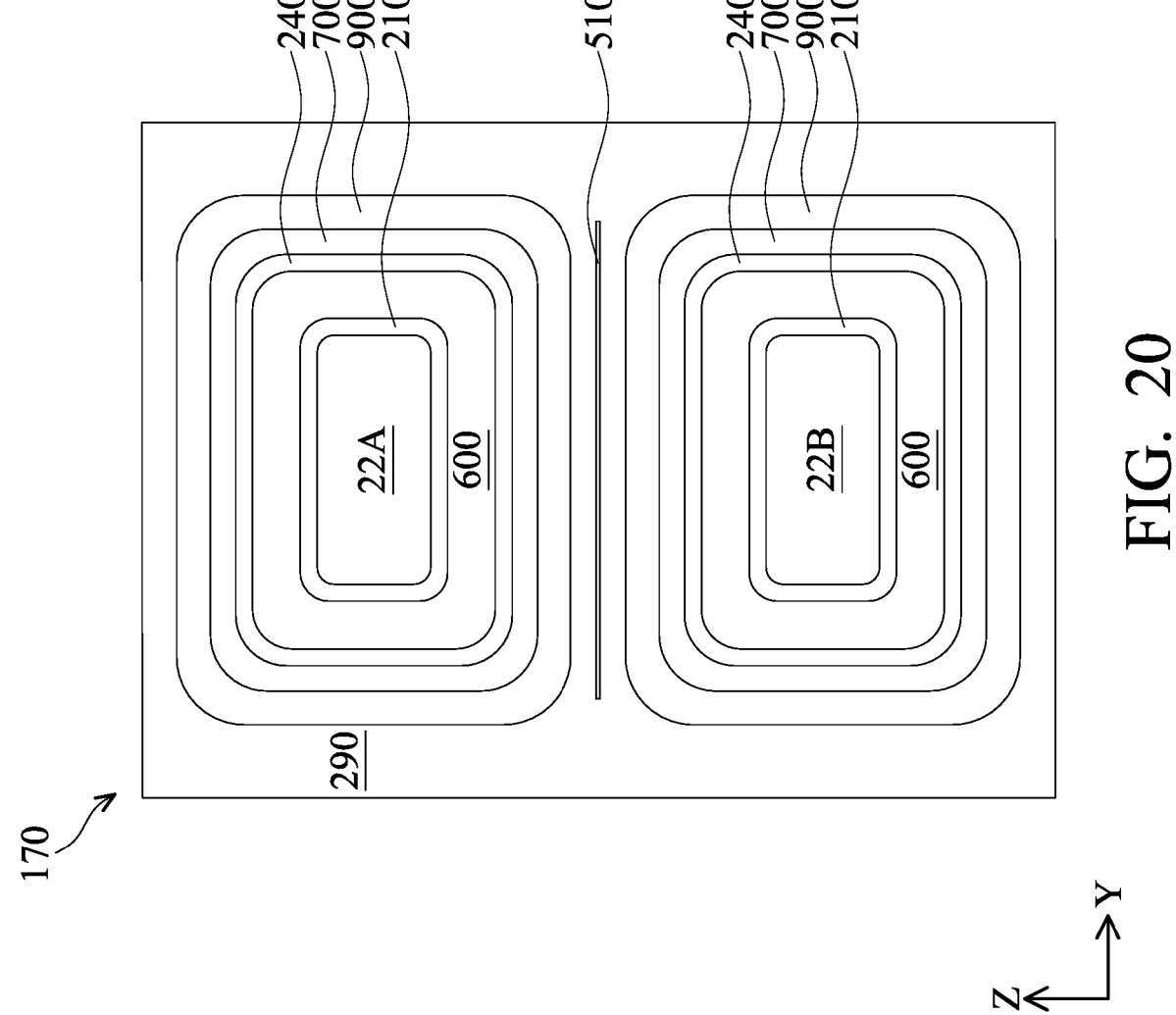
Figure 21:
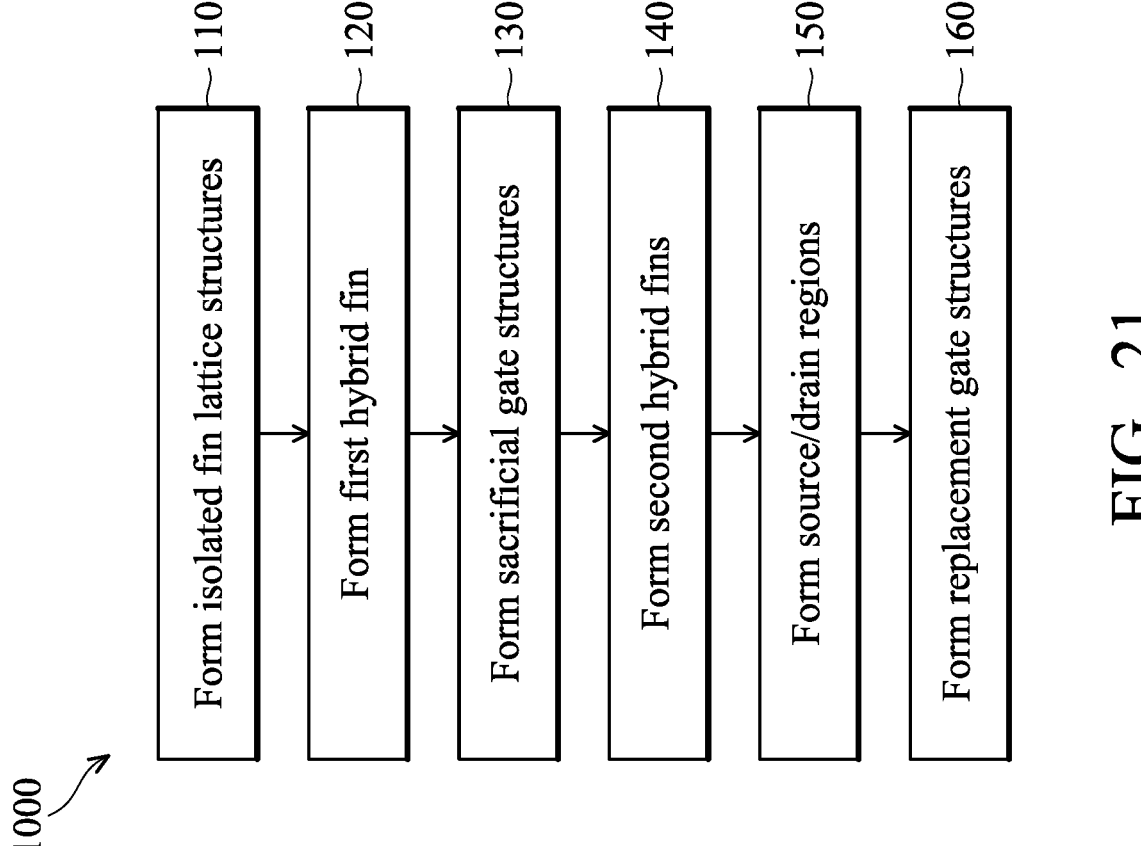
FIG. 21 is a flowchart illustrating a method of fabricating a semiconductor device according to various aspects of the present disclosure.

FIG. 21 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-20, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2 through 20 are perspective views of intermediate stages in the manufacturing of nano-FETs, in accordance with some embodiments.

Figure 2:
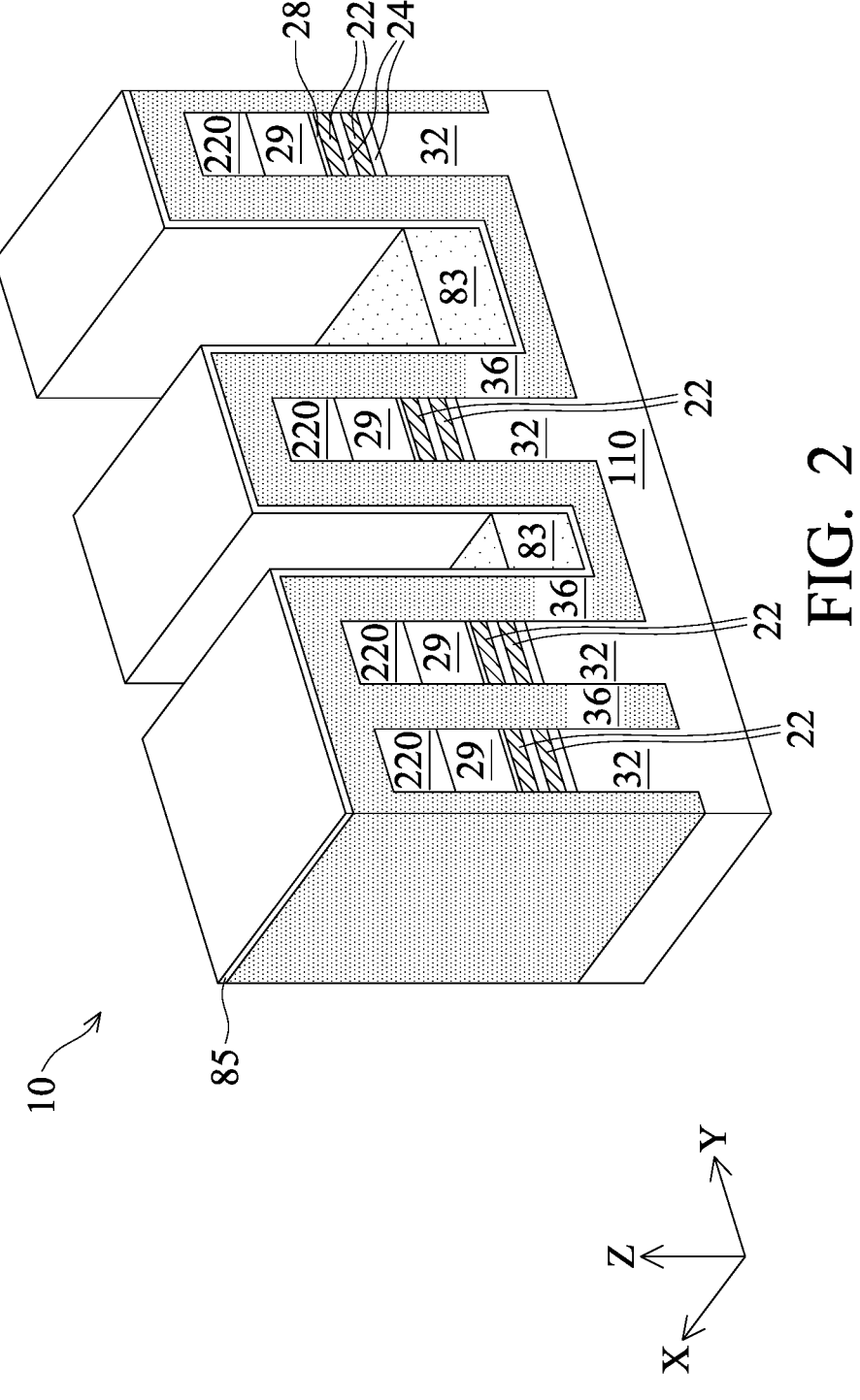
FIGS. 2-20 are views of an IC device of at various stages of fabrication according to various aspects of the present disclosure.

In FIG. 2, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2, a multi-layer stack or "lattice" is formed over the substrate 110 of alternating layers of first semiconductor layers (e.g., precursors to the channels 22) and second semiconductor layers (e.g., precursors to buffer layers 24). In some embodiments, the first semiconductor layers may be formed of a first semiconductor material suitable for n-type nano-FETs, such as silicon, silicon carbide, or the like, and the second semiconductor layers may be formed of a second semiconductor material suitable for p-type nano-FETs, such as silicon germanium or the like. Each of the layers of the multi-layer stack may be epitaxially grown using a process such as chemical vapor deposition (CVD), atomic layer deposition (ALD), vapor phase epitaxy (VPE), molecular beam epitaxy (MBE), or the like.

Two layers of each of the first semiconductor layers and the second semiconductor layers are illustrated. In some embodiments, the multi-layer stack may include one each or three or more each of the first semiconductor layers and the second semiconductor layers. Although the multi-layer stack is illustrated as including a second semiconductor layer as the bottommost layer, in some embodiments, the bottommost layer of the multi-layer stack may be a first semiconductor layer.

Due to high etch selectivity between the first semiconductor materials and the second semiconductor materials, the second semiconductor layers of the second semiconductor material may be removed without significantly removing the first semiconductor layers of the first semiconductor material, thereby allowing the first semiconductor layers to be patterned to form channel regions of nano-FETs. In some embodiments, the first semiconductor layers are removed and the second semiconductor layers are patterned to form channel regions. The high etch selectivity allows the first semiconductor layers of the first semiconductor material to be removed without significantly removing the second semiconductor layers of the second semiconductor material, thereby allowing the second semiconductor layers to be patterned to form channel regions of nano-FETs.

In FIG. 2, fins 32 are formed in the substrate 110 and nanostructures 22, 24 are formed in the multi-layer stack corresponding to act 1100 of FIG. 21. In some embodiments, the nanostructures 22, 24 and the fins 32 may be formed by etching trenches in the multi-layer stack and the substrate 110. The etching may be any acceptable etch process, such as a reactive ion etch (RIE), neutral beam etch (NBE), the like, or a combination thereof. The etching may be anisotropic. First nanostructures 22 (also referred to as "channels" below) are formed from the first semiconductor layers, and second nanostructures 24 are formed from the second semiconductor layers. Distance between adjacent fins 32 and nanostructures 22, 24 (e.g., in the Y-axis direction) may be from about 18 nm to about 100 nm. A portion of the device 10 is illustrated in FIG. 2 including four fins 32 for simplicity of illustration. The process 1000 illustrated in FIGS. 2-19 may be extended to any number of fins, and is not limited to the four fins 32 shown.

As shown in FIG. 2, an oxide layer 28 and a hard mask layer 29 are formed over the top of the first semiconductor layer. In some embodiments, the oxide layer 28 is a pad oxide layer, and the hard mask layer 29 may include silicon. In some embodiments, the hard mask layer 29 includes SiOCN, or another suitable silicon-based dielectric. In some embodiments, a second oxide layer (not shown) is formed over the hard mask layer 29. Formation of the second oxide layer may be similar to that of the oxide layer 28. Hard mask layer 220 may be formed over the hard mask layer 29. In some embodiments, the hard mask layer 220 is or includes any suitable material for forming a hard mask, such as silicon, SiOCN, SiCN, SiON, or the like.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIG. 2 illustrates the fins 32 having straight, vertical sidewalls, such that a width of each of the fins 32 and/or the nanostructures 22, 24 is substantially the same in a direction towards the substrate 110. In some embodiments, the fins 32 may have tapered sidewalls, such that each of the nanostructures 22, 24 may have a different width and be trapezoidal in shape.

Isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner. As shown in FIG. 2, the insulation material may be deposited as a conformal layer having thickness in a range of about 10 nm to about 40 nm. In regions in which neighboring fins 32 are close together (e.g., less than about 40 nm separation, such as less than about 32 nm separation), the insulation material may merge in the space between the neighboring fins 32. In regions in which the neighboring fins 32 are separated by a large distance (e.g., greater than about 10 nm, such as greater than about 50 nm), the insulation material may not merge, and may be deposited on sidewalls of the fins 32 and an upper surface of the substrate 110 with a gap therebetween.

FIG. 2 illustrates formation of the first hybrid fin 84, corresponding to act 1200 of FIG. 21. Following deposition of the insulation material for forming the isolation regions 36, the liner layer 85 is deposited. In one embodiment, the liner layer 85 is or includes a dielectric material, such as SiCN, or the like. The liner layer 85 is deposited as a conformal layer 85 over the insulation material. In some embodiments, the liner layer 85 is deposited having thickness in a range of about 2 nm to about 10 nm.

Following formation of the liner layer 85, a fill layer 83 is deposited in spaces between the fins 32. In some embodiments, the fill layer 83 is or includes silicon oxide. The fill layer 83 may include substantially the same material as the isolation regions 36. In some embodiments, the fill layer 83 is formed by a chemical vapor deposition (CVD) process, such as a flowable CVD (FCVD) operation. The fill layer 83 may be formed to fill the spaces between the fins 32 completely, such that excess material of the fill layer 83 overlies the upper surfaces of the liner layer 85 over the fins 32. Following deposition of the fill layer 83, the excess portions may be removed, for example, by a chemical mechanical polish (CMP), such that the liner layer 85 is exposed, and upper surfaces of the liner layer 85 and the fill layer 83 are substantially coplanar. Following the CMP operation, the fill layer 83 may be recessed by a suitable etching operation, as shown in FIG. 2.

Figure 3:
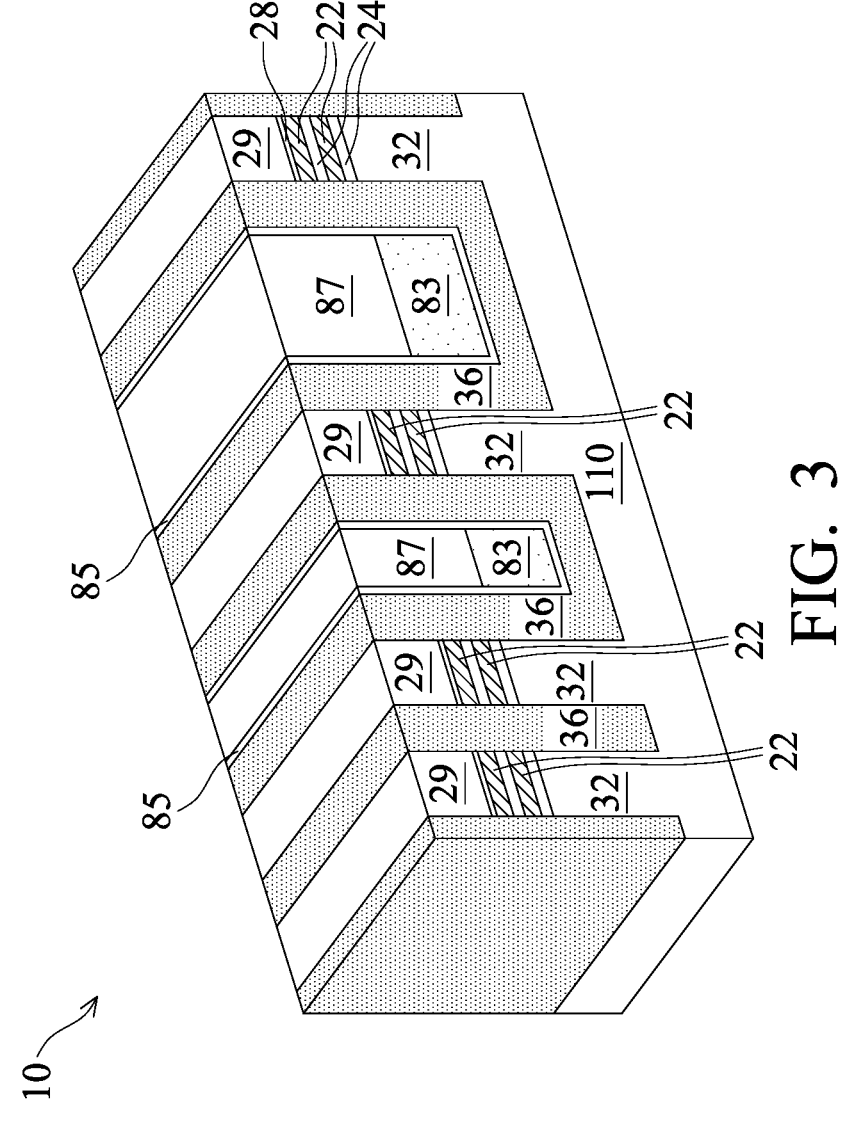

In FIG. 3, the capping layer 87 is formed, corresponding to act 1200 of FIG. 21. The capping layer 87 may be formed following etch back (recessing) of the fill layer 83, and may fill openings over the fill layer 83 between the fins 32. In some embodiments, the capping layer 87 may be or include a material having high etch selectivity with the isolation regions 36. In some embodiments, the capping layer 87 is or includes SiCN, SiCON, a nitride of a non-silicon material, or the like. Material of the capping layer 87 has good etch selectivity relative to the isolation regions 36. In some embodiments, the capping layer 87 fills the openings over the fill layer 83 to the exclusion of other materials. In some embodiments, the capping layer 87 fills the openings, but one or more other materials intervene between the capping layer 87 and the fill layer 83.

The first hybrid fins 84 include the liner layer 85, the fill layer 83 and the capping layer 87. Following formation of the capping layer 87, excess material of the capping layer 87 may be removed from over the fins 32 and the isolation regions 36, for example, by a CMP. Following the CMP, upper surfaces of the capping layer 87, the liner layer 85, the isolation regions 36 and the hard mask layer 29 may be coplanar or substantially coplanar (e.g., some surface roughness may be present on each of the mentioned surfaces). The first hybrid fins 84 extend continuously in the X-axis direction from a front surface of the fins 32 to an opposite rear surface of the fins 32. The first hybrid fins 84 are embedded in the isolation regions 36.

Figures 4A, 4B:
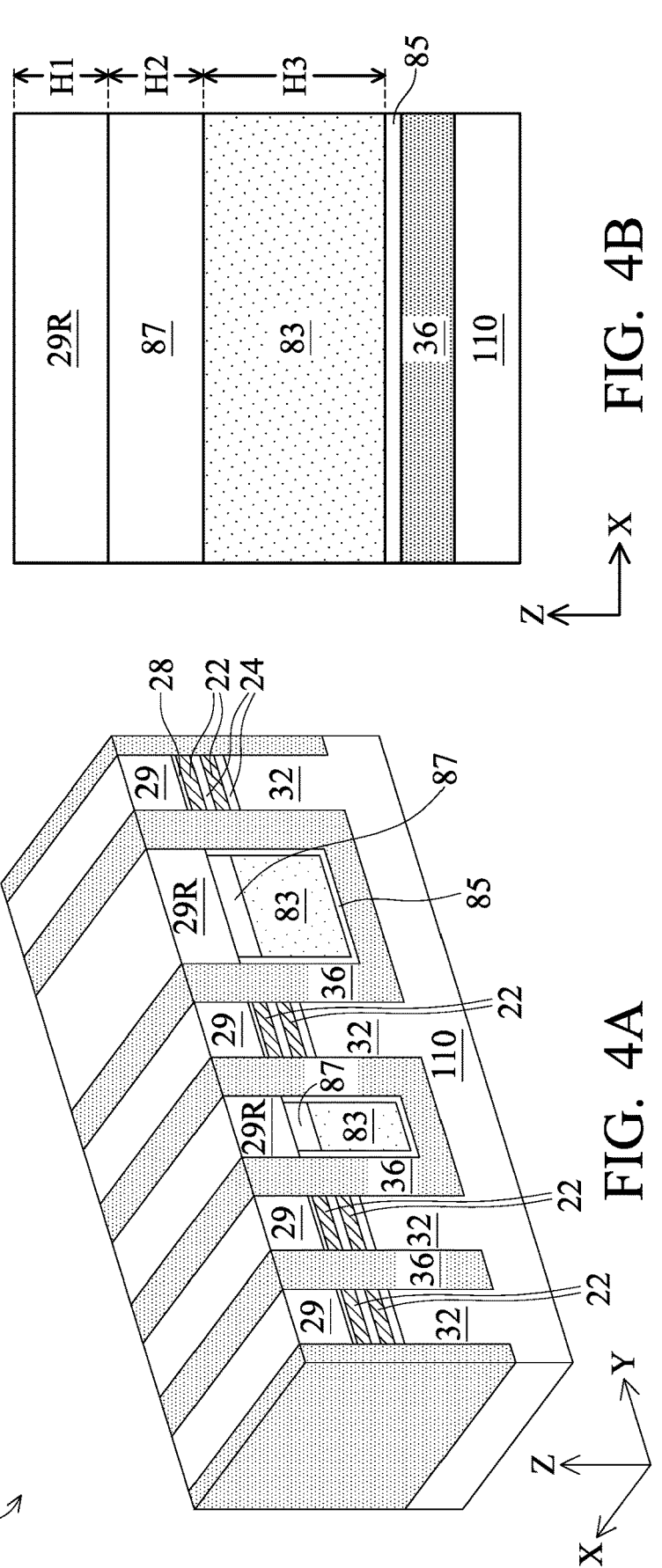

In FIG. 4A, the capping layer 87 and the liner layer 85 are recessed (e.g., etched back), forming trenches that extend in the X-axis direction. During recessing of the capping layer 87 and the liner layer 85, the isolation regions 36 are substantially unaltered due to high etch selectivity between the isolation regions 36 and the capping and liner layers 87, 85. Following recessing of the capping layer 87 and the liner layer 85, a replacement hard mask layer 29R, which may also be referred to as a second capping layer 29R, is deposited in the trenches overlying the first hybrid fins 84. The replacement hard mask layer 29R may be formed of a material having high etch selectivity relative to the isolation regions 36, and may include, for example, polysilicon. In some embodiments, the replacement hard mask layer 29R includes the same or substantially the same material as the hard mask layer 29, such that the replacement hard mask layer 29R and the hard mask layer 29 have the same or substantially the same etch rate, and may be removed in a uniform manner in a later etching operation. In some embodiments, the replacement hard mask layer 29R is formed by depositing a layer of material (e.g., polysilicon), then removing excess material of the layer, for example, by a CMP. Following removal of the excess material of the replacement hard mask layer 29R, upper surfaces of the hard mask layer 29 and the isolation regions 36 are coplanar or substantially coplanar (e.g., having surface roughness) and are exposed.

When forming the replacement hard mask layer 29R, a bottom surface of the replacement hard mask layer 29R may be substantially level with respective upper surfaces of the channels 22 (e.g., the uppermost channels 22A shown in FIG. 1C) most distal the substrate 110. With reference to FIG. 4B, height H1 of the replacement hard mask layer 29R along the Z-axis direction may be in a range of about 10 nm to about 60 nm. Height H2 of the capping layer 87 along the Z-axis direction may be in a range of about 5 nm to about 50 nm. Height H3 of the fill layer 83 along the Z-axis direction may be in a range of about 10 nm to about 150 nm. As described above with reference to FIG. 2, thickness of the liner layer 85 may be in a range of about 2 nm to about 10 nm. Height of the hybrid fin 84 including the liner layer 85, the fill layer 83 and the capping layer 87 may be in a range of about 17 nm to about 210 nm. The hybrid fin 84 may be separated from (e.g., above) the substrate 110 in the Z-axis direction by a distance in a range of about 10 nm to about 40 nm, corresponding to thickness of the isolation region 36. The hybrid fin 84 may be separated laterally from the fins 32 and nanostructures 22 in the Y-axis direction by a distance in a range of about 10 nm to about 40 nm, corresponding to thickness of the isolation region 36.

Figure 5:
Figure 5:
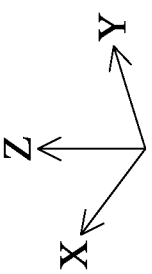
Figure 11:
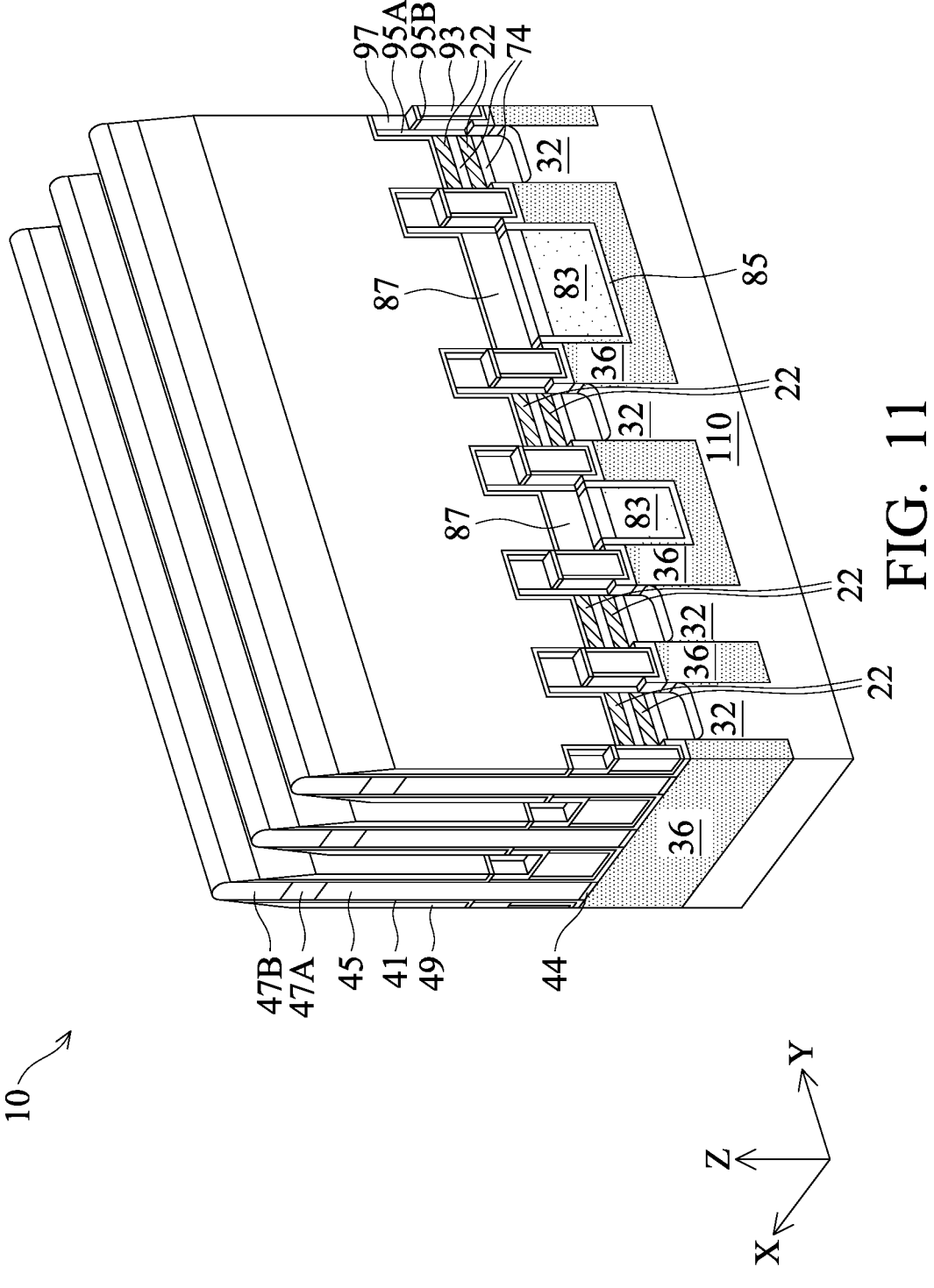

In FIG. 5, the insulation material of the isolation regions 36 undergoes a removal process, such as an etch-back process with top surfaces of the nanostructures 22 protected by the hard mask layer 29, and with top surfaces of the hybrid fins 84 protected by the replacement hard mask layer 29R. The insulation material is recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered. Following etch back of the isolation regions 36, the top surface of the isolation regions 36 may be coplanar with or substantially coplanar with the top surface of the fins 32 or the bottom surface of the nanostructures 24 most proximal the substrate 110. In some embodiments, the top surface of the isolation regions 36 is lower than (e.g., closer to the substrate 110) the bottom surface of the nanostructures 24 most proximal the substrate 110 by a distance in a range of about 3 nm to about 10 nm. Recessing the isolation regions 36 to a level slightly below the top surface of the fins 32 may be beneficial in subsequent operations, such as formation of second hybrid fins 94 (FIGS. 6A-8B) and formation of source/drain epitaxial regions 82 (FIG. 11). In some embodiments, the top surface of the isolation regions 36 is substantially level with the bottom surface of the nanostructures 24 most proximal the substrate 110.

FIGS. 2-5 illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 5, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

In FIG. 5, following recessing of the isolation structures 36, dummy gate structures 40 (or "sacrificial gate structures 40") are formed over the fins 32 and/or the nanostructures 22, 24, corresponding to act 1300 of FIG. 21. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), chemical vapor deposition (CVD), sputter deposition, or other techniques for depositing the selected material. A mask layer 47, which may include a first mask layer 47A and a second mask layer 47B, is formed over the dummy gate layer 45, and may include, for example, silicon nitride, silicon oxynitride, or the like. In some embodiments, a gate dielectric layer 44 is formed before the dummy gate layer 45 between the dummy gate layer 45 and the fins 32 and/or the nanostructures 22, 24.

Figure 6A:
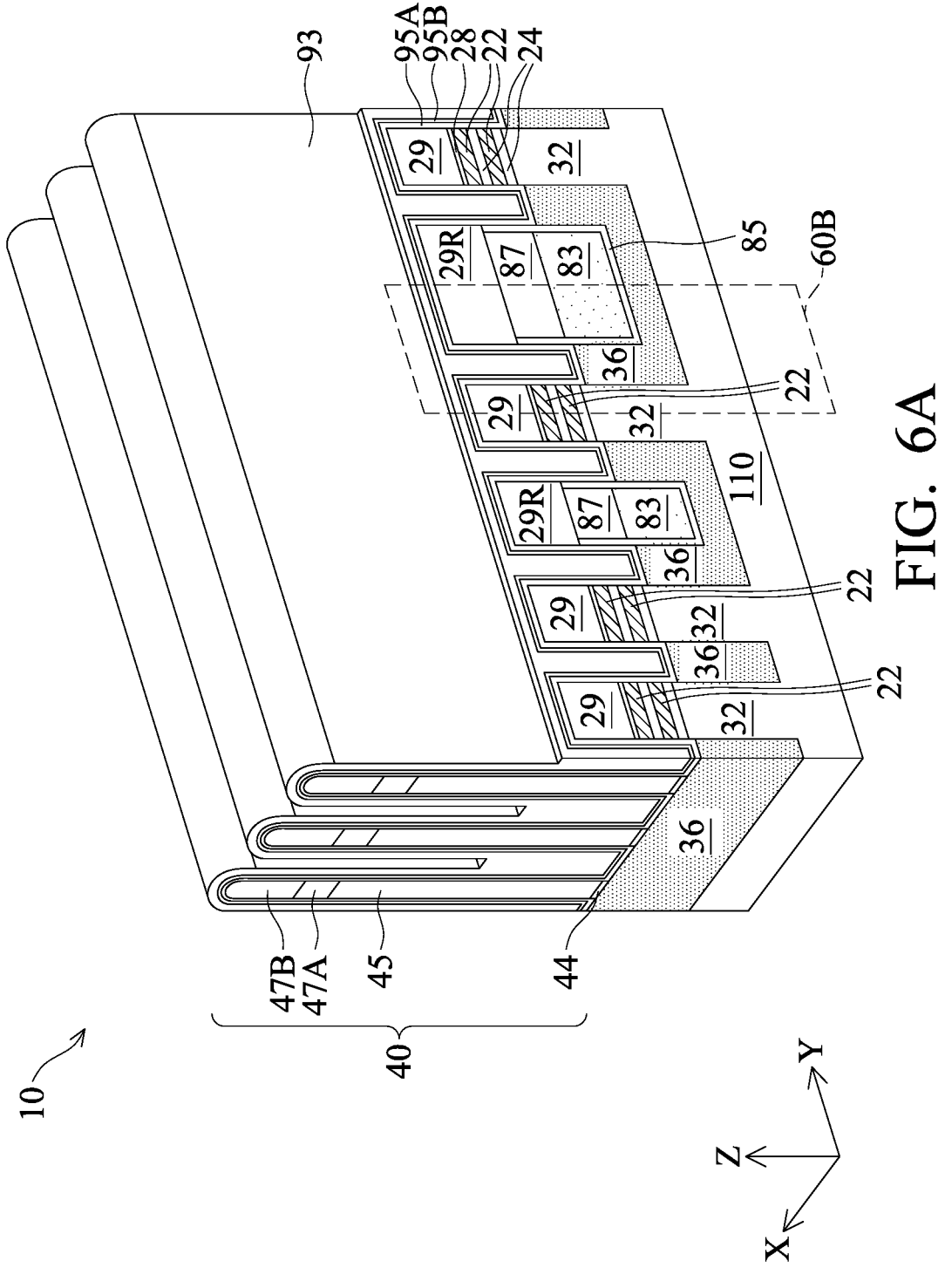
Figure 6B:
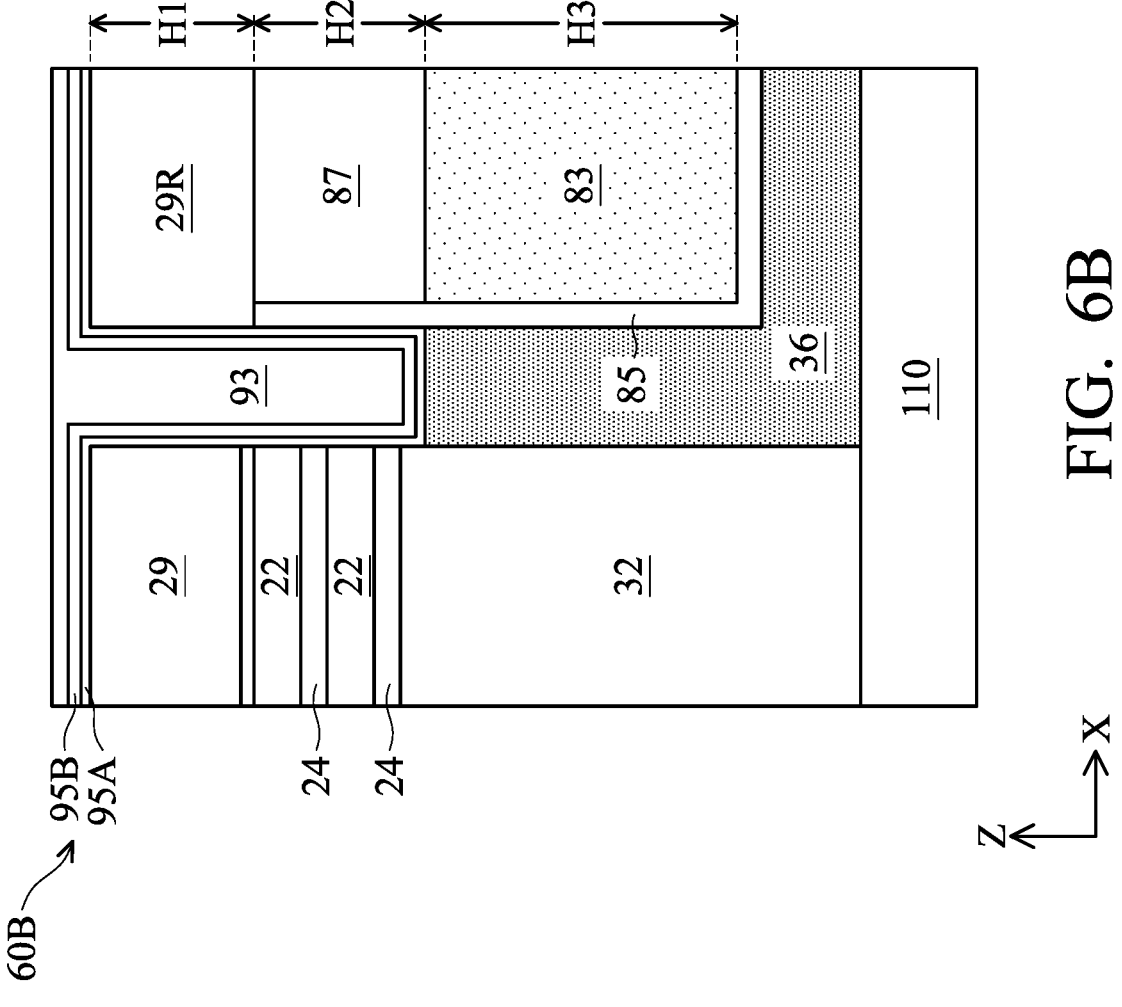

In FIGS. 6A-8B, the second hybrid fins 94 are formed, corresponding to act 1400 of FIG. 21. FIG. 6A is a perspective view of the device 10. FIG. 6B shows a region 60B of FIG. 6A in cross-sectional view in the X-Z plane. In FIGS. 6A, 6B, one or more liner layers 95A, 95B are formed. In some embodiments, a single liner layer (e.g., first liner layer 95A) is formed, and second liner layer 95B is omitted. The liner layers 95A, 95B may be formed by conformal deposition of a first material of the first liner layer 95A, followed by a second conformal deposition of a second material of the second liner layer 95B. The first and second materials may be the same, substantially the same, or different. In some embodiments, the first and second materials are SiCON. The liner layers 95A, 95B are deposited to have a thickness in a range of about 2 nm to about 5 nm, each. Following deposition of the liner layers 95A, 95B, a fill layer 93 is formed. The fill layer 93 may also be referred to as a core layer 93. The fill layer 93 may include an oxide or a nitride, such as silicon oxide, silicon nitride, or the like. The material of the fill layer 93 may have high etch selectivity relative to the first and second materials of the liner layers 95A, 95B. Because the dummy gate structures 40 are formed before the second hybrid fins 94, the second hybrid fins 94 are formed between the dummy gate structures 40 along the X-axis direction, and do not extend through the dummy gate structures 40. As such, when the dummy gate structures 40 are replaced with active gate structures 200 in subsequent operations, the second hybrid fins 94 are not present in the openings in which the active gate structures 200 are to be formed, providing increased space for forming the active gate structures 200. This allows for reduced incidence of voids, seams or other defects in the active gate structures 200, which improves yield.

Figure 7A:
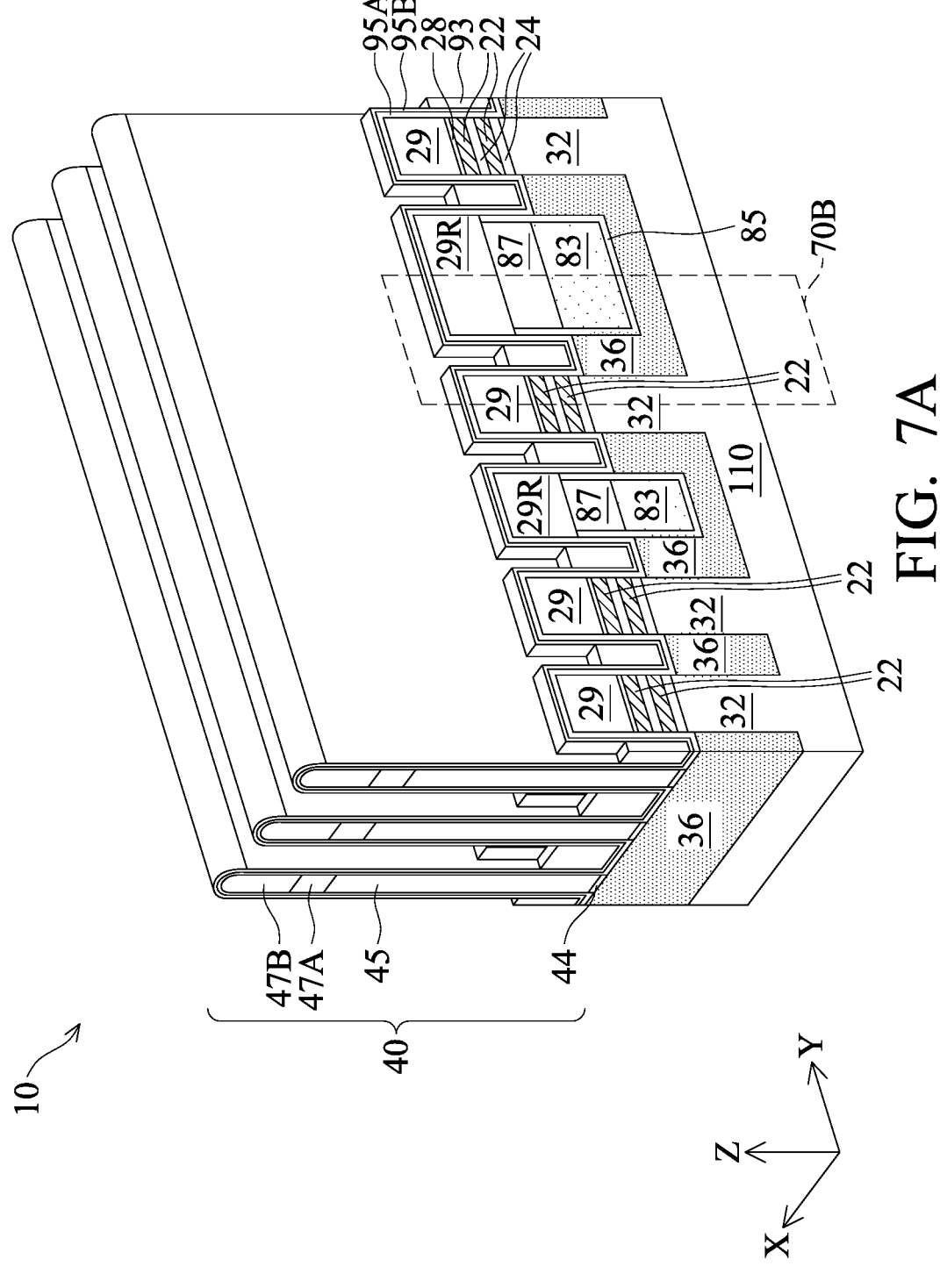
Figures 7B, 7C:
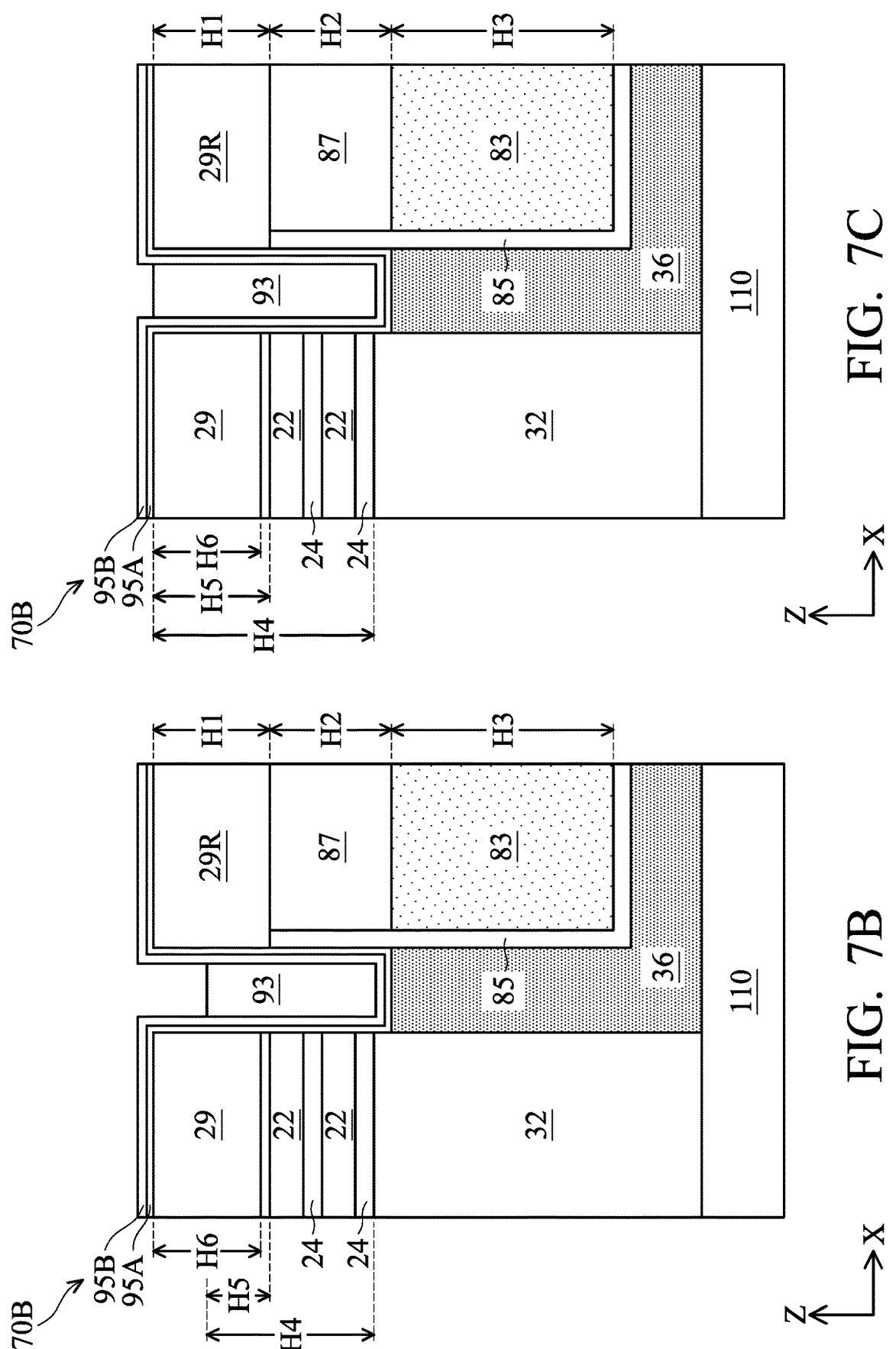

In FIGS. 7A-7C, the fill layer 93 is recessed. FIG. 7A shows a perspective view of the device 10, and FIGS. 7B and 7C show a cross-sectional view of a region 70B in the X-Z plane. Recessing of the fill layer 93 may be by an isotropic etch operation that removes material of the fill layer 93 without substantially attacking material of the liner layer 95B. Following recessing of the fill layer 93, the upper surface of the fill layer 93 may be at a level substantially level with the top surface of the uppermost channel 22, or may be at a level somewhat above the top surface of the uppermost channel 22. In some embodiments, the upper surface of the fill layer 93 is at the same, or substantially the same, level as the top surface of the hard mask layer 29 (see FIG. 7C). The configuration shown in FIG. 7C may obviate inclusion of an additional capping layer 97 in a subsequent operation, described with reference to FIGS. 8A-8C. Referring to FIG. 7B and FIG. 7C, height H4 in the Z-axis direction of the fill layer 93 may be in a range of about 10 nm to about 60 nm. Height H5 in the Z-axis direction is difference in level between the upper surface of the fill layer 93 and the top surface of the uppermost channel 22, and may be in a range of about 0 nm (FIG. 7C) to about 20 nm. Height H6 in the Z-axis direction of the hard mask layer 29 may be in a range of about 20 nm to about 80 nm.

Figure 8A:
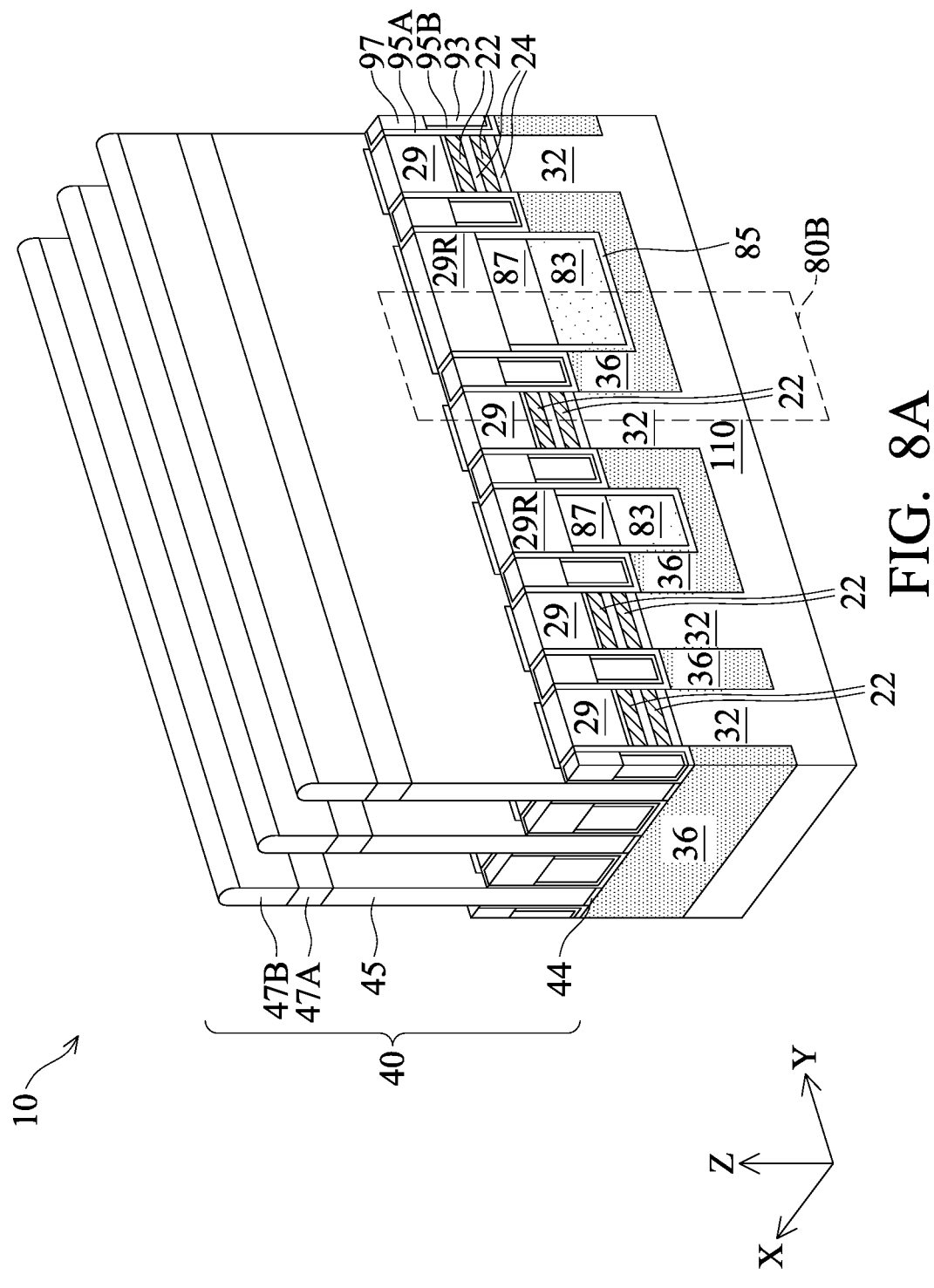
Figures 8B, 8C:
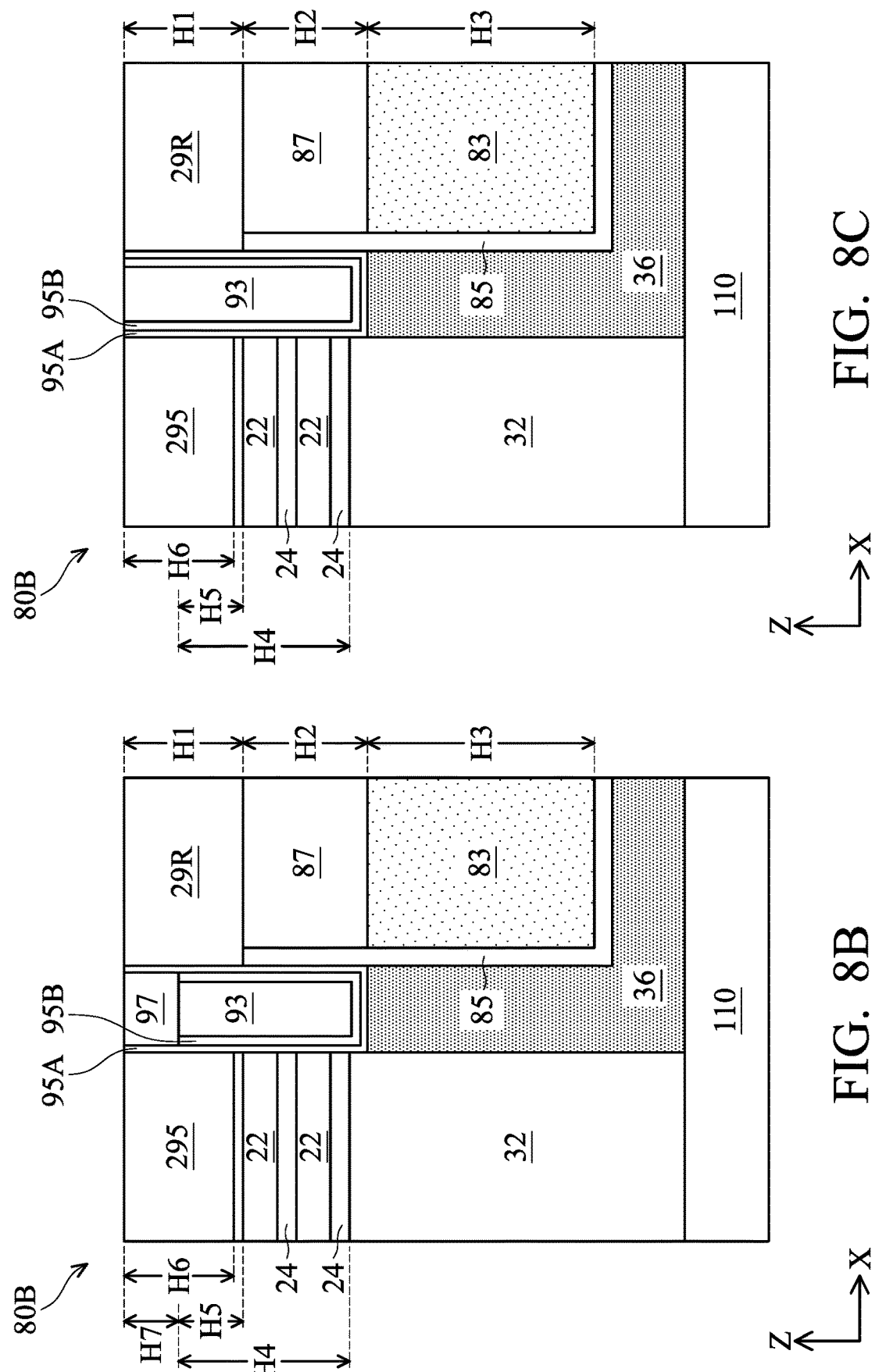

In a region 80B of FIGS. 8A, 8B, a capping layer 97 is formed in openings over the second liner layer 95B and the fill layer 93. The capping layer 97 may include a dielectric material, such as a high-k dielectric material. Following recessing of the fill layer 93, portions of the second liner layer 95B, when present, may be removed to enlarge the openings. For example, a region of the second liner layer 95B not covered by the fill layer 93 may be removed to enlarge the openings. Removing the exposed region of the second liner layer 95B as described may improve ability to form the capping layer 97 in the openings in a subsequent process. In some embodiments, the second liner layer 95B is not recessed prior to formation of the capping layer 97, and the second liner layer 95 is present in the openings when material of the capping layer 97 is deposited.

The capping layer 97 may be formed by depositing a dielectric material in the openings overlying the fill layer 93. In some embodiments, the dielectric material is a high-k dielectric material, and may include $HfO_2$, HfSiO, HfSiON, HfTaO, HfTiO, HfZrO, $ZrO_2$, $Ta_2O_5$, a combination thereof or the like. Following deposition of the capping layer 97, excess material of the capping layer 97 overlying the hard mask layer 29 and the replacement hard mask layer 29R may be removed, for example, by a lateral etch back operation, which may be an isotropic etch operation. The capping layer 97, when present, is illustrated in FIG. 8B. Height H7 in the Z-axis direction of the capping layer 97 may be in a range of about 30 nm to about 80 nm.

Following deposition and etch back of the capping layer 97, portions of the liner layers 95A, 95B overlying the dummy gate structures 40, the hard mask layer 29 and the replacement hard mask layer 29R may be removed, resulting in the structure shown in FIG. 8A.

FIG. 8C illustrates the region 80B of the device 10 in which the capping layer 97 is not formed. In some embodiments, the fill layer 93 is not recessed, and upper surfaces of the fill layer 93, the hard mask layer 29, the replacement hard mask layer 29R and the liner layers 95A, 95B are coplanar or substantially coplanar.

Figure 9:
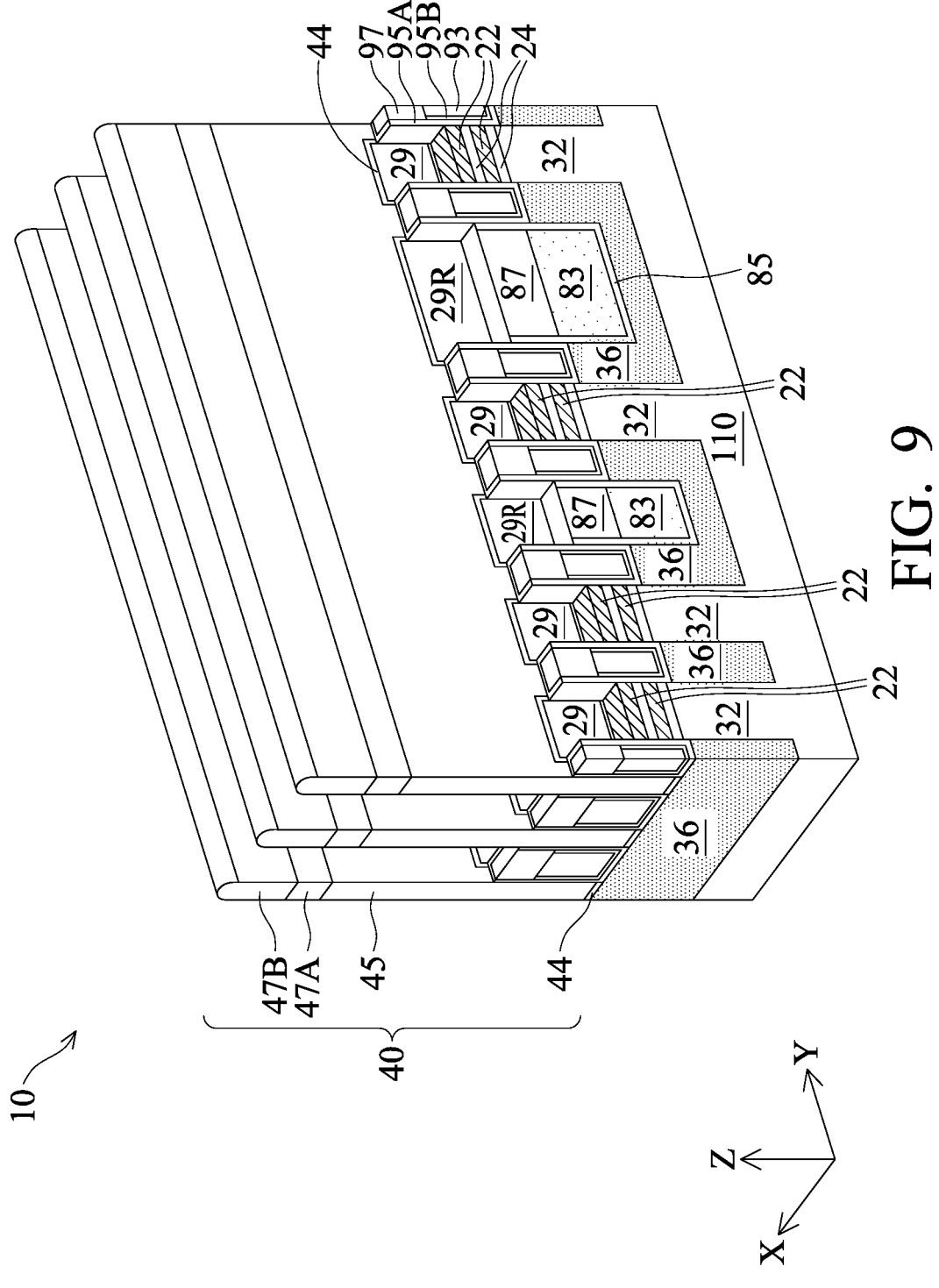

In FIG. 9, following formation of the capping layer 97, exposed regions of the hard mask layer 29 and the replacement hard mask layer 29R are removed. The exposed regions may be regions not covered by the dummy gate structures 40. The exposed regions may be removed by a suitable etching process, such as an isotropic etch. Following removal of the exposed regions, portions of the gate dielectric layer 44 overlying the nanostructures 22 and the first hybrid fins 84 are exposed. The exposed portions of the gate dielectric layer 44 are removed to expose the uppermost nanostructures 22, the liner layer 85 and the capping layer 87. As shown in FIG. 9, the second hybrid fins 94 may have reduced height following removal of the exposed regions of the hard mask layer 29, the replacement hard mask layer 29R and the gate dielectric layer 44. This may be observed in that the upper surfaces of the liner layer 95A and the capping layer 97 are recessed slightly relative to the upper surface of the remaining portions of the hard mask layer 29 and the replacement hard mask layer 29R under the dummy gate structure 40.

Figure 10:
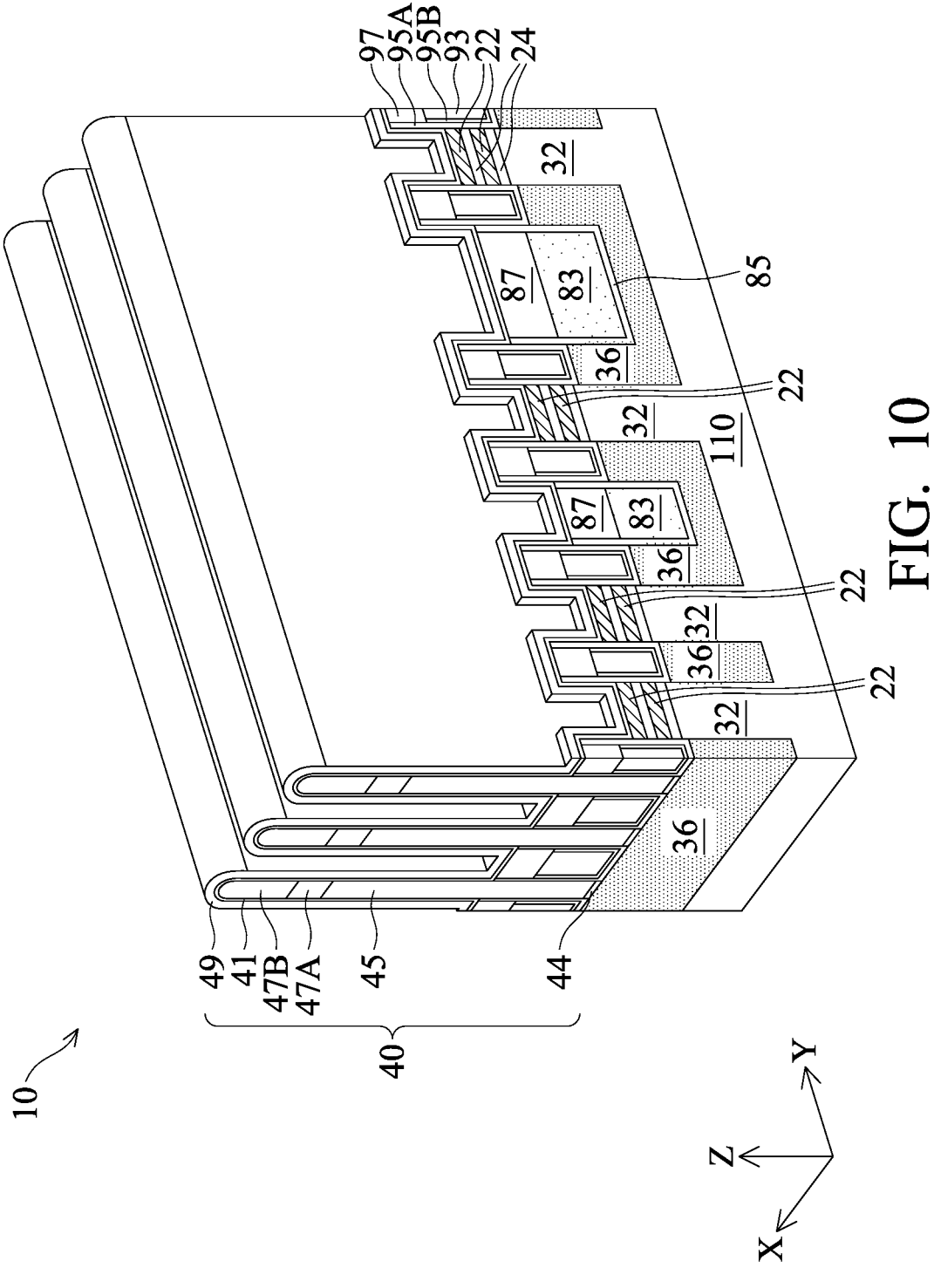

In FIG. 10, a spacer layer 41 is formed over sidewalls of the mask layers 47A, 47B and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer over the mask layers 47A, 47B and the dummy gate layer 45. The spacer layer 41 may be deposited over the exposed surfaces of the capping layer 97, the liner layer 95A, the uppermost channels 22 and the second hybrid fins 84, as illustrated in FIG. 10. Following deposition of the spacer layer 41, the spacer layer 49 may be deposited over the spacer layer 41. In some embodiments, the spacer layer 49 is formed by depositing polysilicon as a conformal layer over the spacer layer 41. Each of the spacer layer 41 and the spacer layer 49 may be deposited as a single layer or multiple layers (e.g., two layers). In some embodiments, the spacer layer 49 is omitted.

FIG. 10 illustrates one process for forming the spacer layer 41. In some embodiments, the spacer layer 41 is formed alternatively or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as the gate structure 200.

In FIG. 11, an etching process is performed to etch the portions of protruding fins 32 and/or nanostructures 22, 24 that are not covered by dummy gate structures 40, resulting in the structure shown. The etching process may include multiple different etching operations for etching materials of the fins 32, the nanostructures 22, the nanostructures 24, the capping layer 97, the capping layer 87, the liner layer 85, and the first liner layer 95A. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36, in accordance with some embodiments. The top surfaces of the recessed fins 32 may be lower than the top surfaces of the isolation regions 36, as shown in FIG. 11.

In some embodiments, the capping layer 97 of the second hybrid fins 94 and the capping and liner layers 87, 85 of the first hybrid fins 84 are recessed by the etching operation that etches the protruding fins 32 and nanostructures 22, 24. The exposed portion of the capping layer 97 may have thickness greater than about 3 nm following the recessing of the protruding fins 32 and nanostructures 22, 24. In some embodiments, the exposed portion of the capping layer 97 is removed completely, such that the fill layer 93 is exposed.

In some embodiments, the first liner layer 95A is recessed in the etching process of FIG. 11. Following etching of the first liner layer 95A, an upper surface of the first liner layer 95A may be substantially coplanar with an upper surface of the capping layer 87. Recessing the first liner layer 95A to a level below, at, or just slightly above the bottom surface of the lowermost nanostructure 22 allows source/drain regions 82 formed in a subsequent operation (see FIG. 12) to extend laterally past the nanostructures 22 (e.g., by a distance in a range of about 2 nm to about 5 nm), which may be beneficial to increasing contact area between the nanostructures 22 and the source/drain regions 82.

Following recessing of the protruding fins 32, the capping layer 97, the first liner layer 95A, the capping layer 87, the liner layer 85, and nanostructures 22, 24, inner spacers 74 are formed, which is also illustrated in FIG. 11. A selective etching process is performed to recess end portions of the nanostructures 24 exposed by openings in the spacer layers 41, 49 without substantially attacking the nanostructures 22. After the selective etching process, recesses are formed in the nanostructures 24 at locations where the removed end portions used to be.

Next, an inner spacer layer is formed to fill the recesses in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 11.

Figure 12:
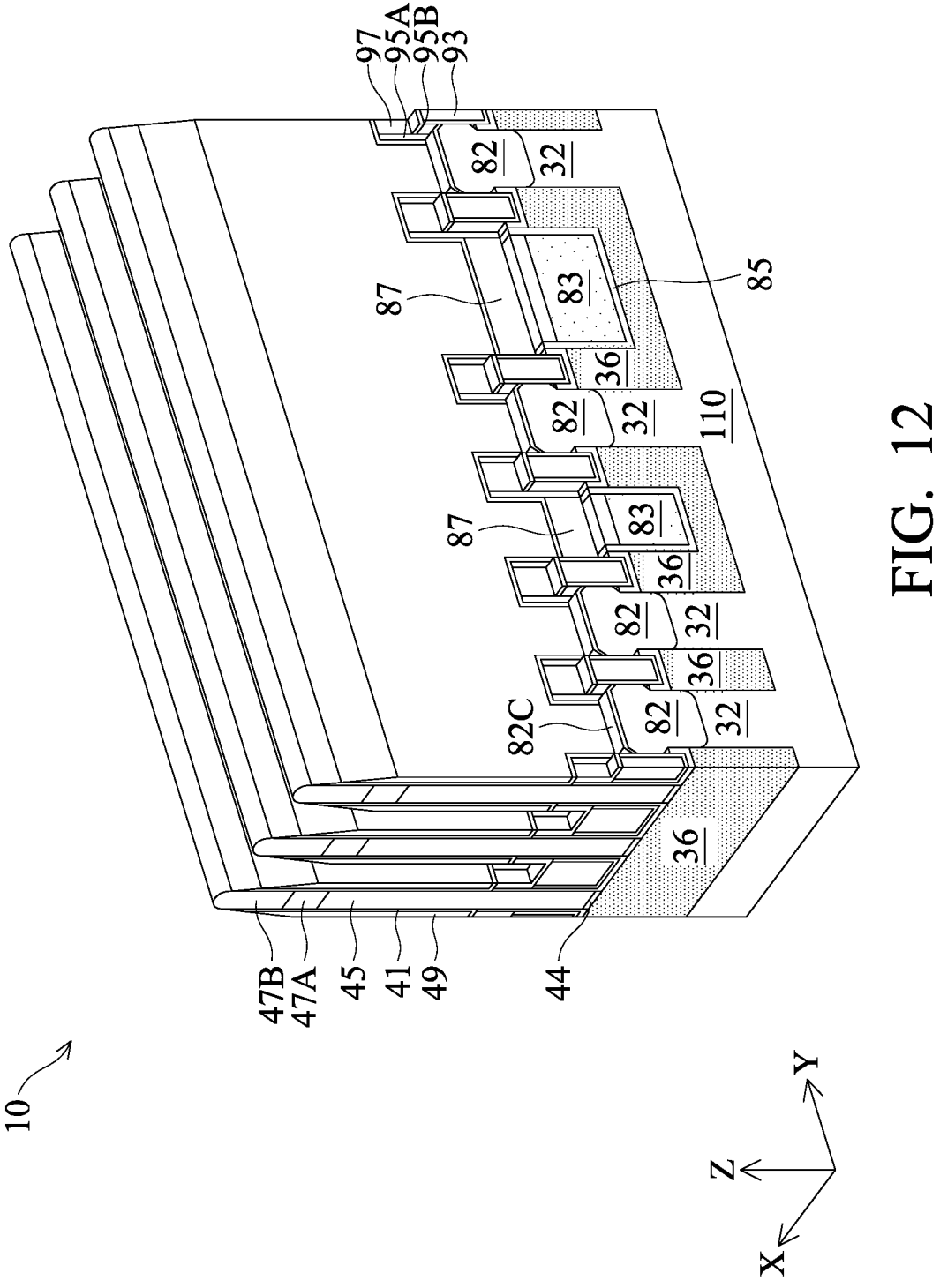

FIG. 12 illustrates formation of source/drain regions 82 corresponding to act 1500 of FIG. 21. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layers 41, 49 separate the source/drain regions 82 from the dummy gate layer 45 by an appropriate lateral distance to prevent electrical bridging to subsequently formed gates (e.g., the gate structures 200) of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32. Generally, merging of neighboring source/drain regions 82 is prevented by inclusion of the second hybrid fins 94. When merging is desired, a second hybrid fin 94 may be omitted between the neighboring source/drain regions 82, such that growth of the neighboring source/drain regions 82 is not blocked (e.g., constrained) by the presence of the second hybrid fin 94 adjacent thereto.

The source/drain regions 82 may have lateral sidewalls in the Y-axis direction that contact the second liner layer 95B of the second hybrid fins 94. The source/drain regions 82 may contact the first liner layer 95A on sidewalls thereof, as well as on upper surfaces thereof. In some embodiments, the source/drain regions 82 are separated from the upper surfaces of the first liner layer 95A by gaps, as shown in FIG. 12. Upper surfaces of the source/drain regions 82 may be at a level lower than (e.g., nearer the substrate 110) the tops of the second hybrid fins 94.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth.

Optional epitaxial capping layers 82C may be formed overlying the source/drain regions 82. In some embodiments, the epitaxial capping layers 82C have low SiGe concentration. For example, SiGe concentration in the epitaxial capping layer 82C may be lower than in the source/drain regions 82. Upper surfaces of the epitaxial capping layers 82C may be at a level lower than (e.g., nearer the substrate 110) the tops of the second hybrid fins 94, as shown in FIG. 12.

Figure 13:
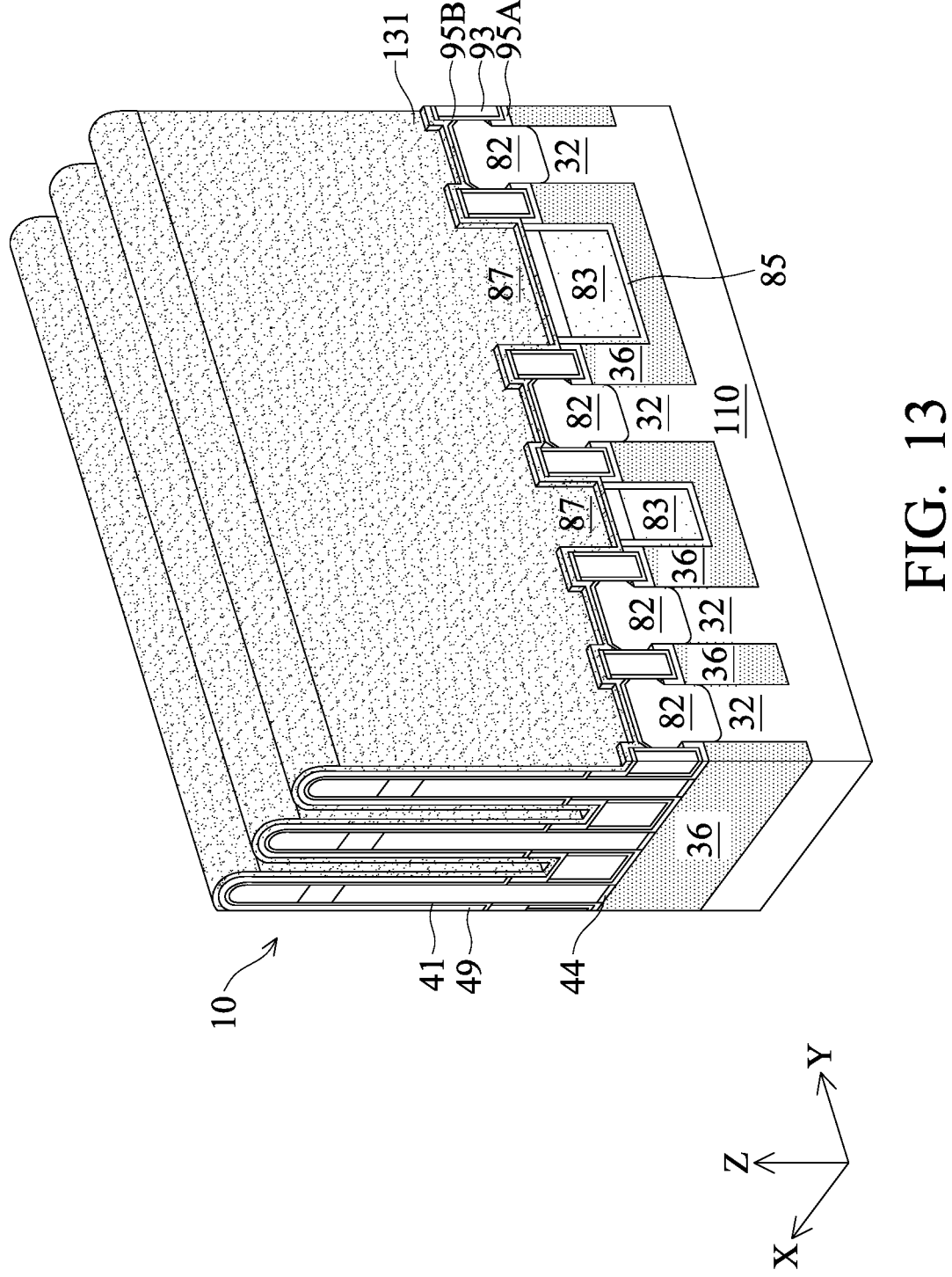

In FIG. 13, a contact etch stop layer (CESL) 131 is formed as a conformal layer overlying the gate spacers 41, 49, the second hybrid fins 94, the source/drain regions 82, and the first hybrid fins 84. The CESL 131 may be a dielectric material layer, and may include silicon nitride or another suitable material. In some embodiments, the CESL 131 is or includes SiN, SiCN, SiC, SiOC, SiOCN, $HfO_2$, $ZrO_2$, $ZrAlO_x$, $HfAlO_x$, $HfSiO_x$, $Al_2O_3$, a combination thereof, or other suitable material. In some embodiments, thickness of the CESL 131 is in a range of about 1 nm to about 5 nm.

Figure 14:
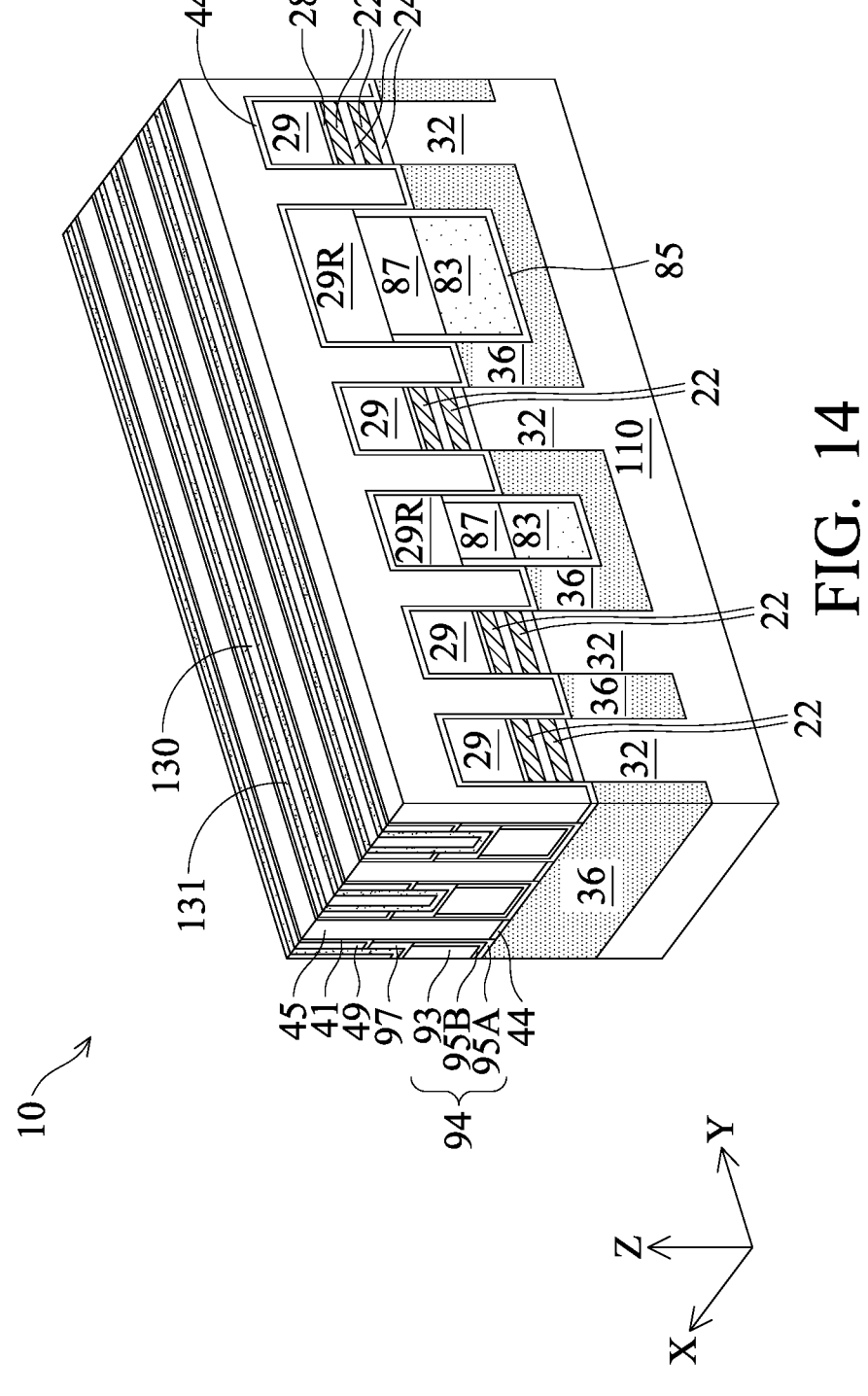

In FIG. 14, an interlayer dielectric (ILD) 130 is then formed. Initially, the ILD 130 may cover the dummy gate structures 40, the second hybrid fins 94, the first hybrid fins 84, and the source/drain regions 82. Excess material of the ILD 130 may then be removed, resulting in the structure shown in FIG. 14. The ILD 130 may include an appropriate dielectric material, such as SiO, SiN, SiC, SiOCN, SiOC, SiCN, AlO, AlON, ZrSi, ZrO, ZrN, ZrAlO, LaO, HfO, HfSi, YO, TiO, TaO, TaCN, ZnO, combinations thereof, or other suitable dielectric materials.

Figure 15:
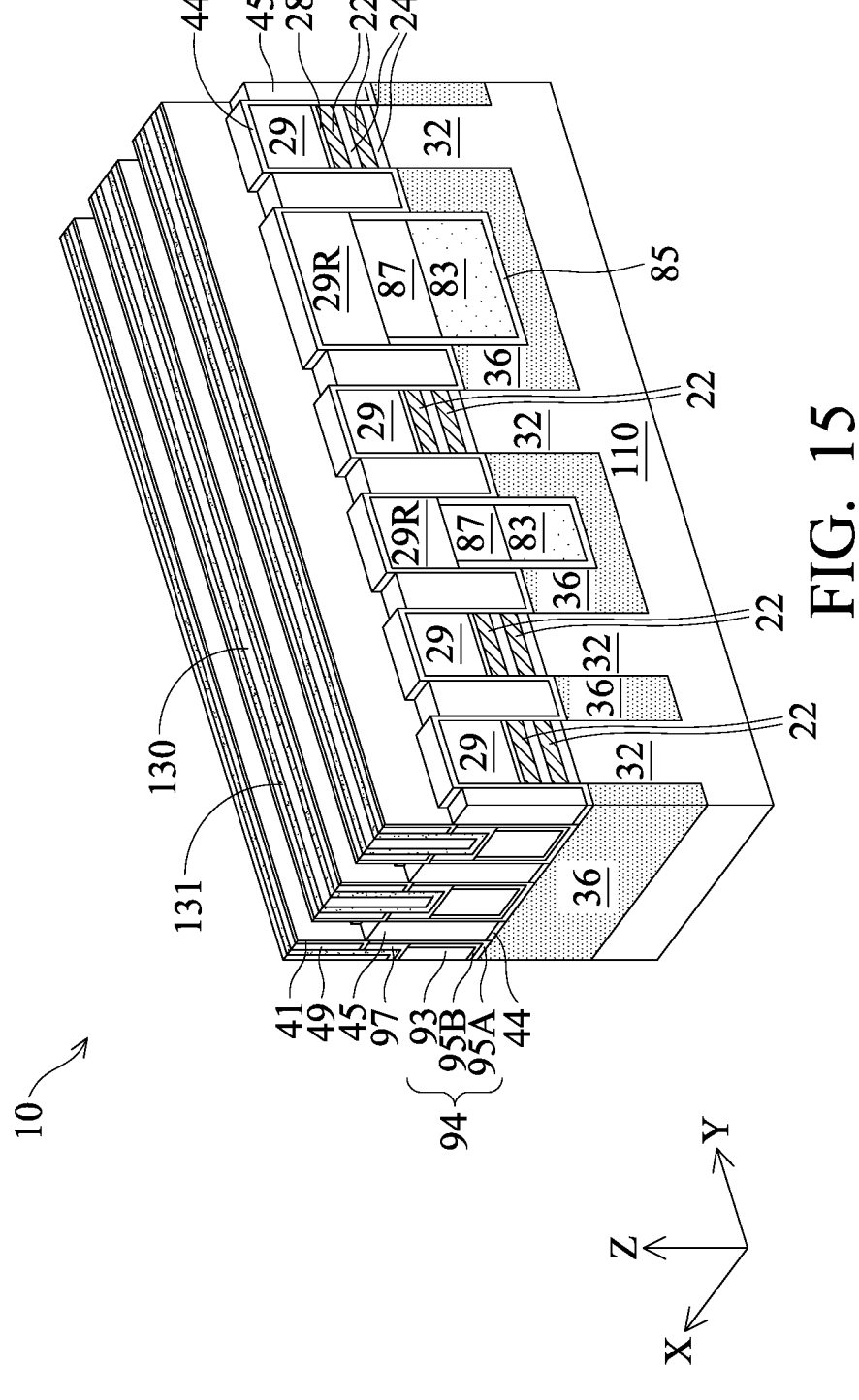
Figure 16:
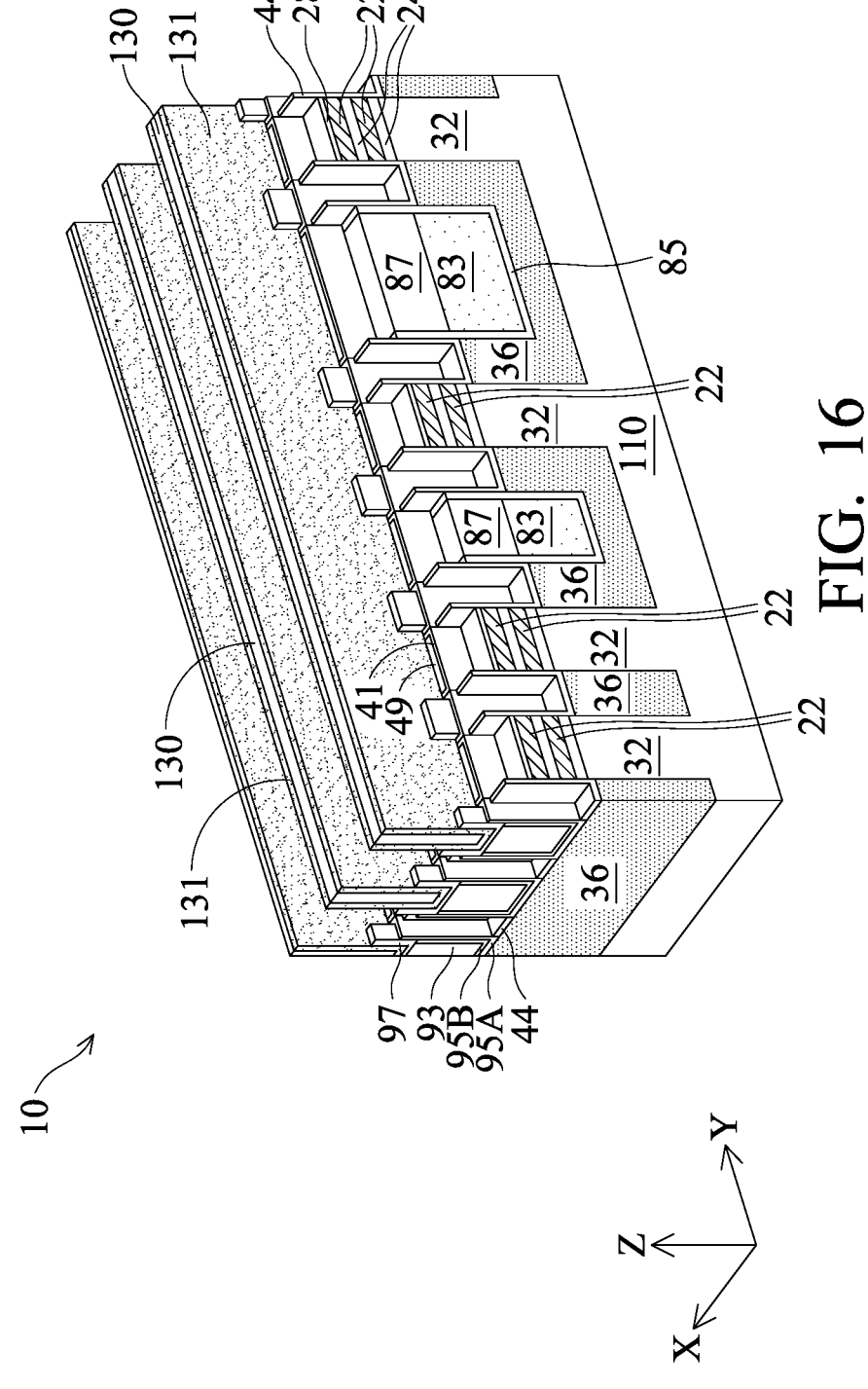
Figure 17:
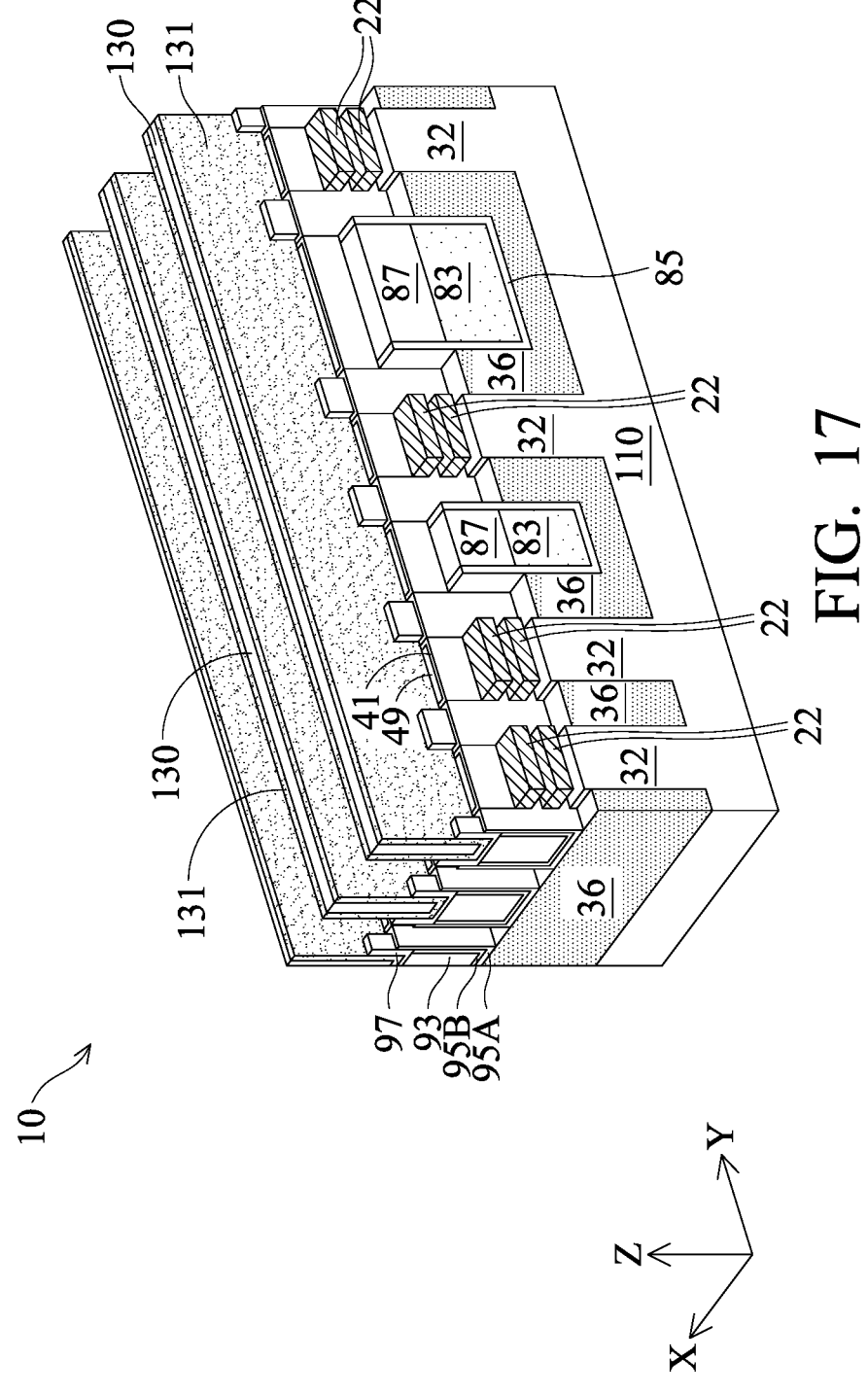

FIGS. 15-17 illustrate release of fin channels 22 by removal of the nanostructures 24, the mask layer 47, and the dummy gate layer 45. A planarization process, such as a CMP, may be performed to level the top surfaces of the dummy gate layer 45, ILD 130, CESL 131, and gate spacer layers 41, 49. The planarization process may also remove the mask layers 47A, 47B from over the dummy gate layer 45. Accordingly, the top surfaces of the dummy gate layer 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layers 41, 49, the CESL 131 and the ILD 130. The dummy gate dielectric 44, when present, may be used as an etch stop layer when the dummy gate layer 45 is etched. Following partial removal of the dummy gate layer 45 up to the gate dielectric layer 44, the gate dielectric layer 44 is exposed, as shown in FIG. 15.

In FIG. 16, exposed upper portions of the gate dielectric layer 44 are removed by a suitable etching operation. The cutaway in the perspective view of FIG. 16 is offset from the view of FIG. 13, and shows the channels 22 and gate region. In the same etching operation used to remove the exposed upper portions of the gate dielectric layer 44, or in a different (e.g., subsequent) etching operation, the gate spacer layers 41, 49 and the first liner layer 95A of the second hybrid fins 94 are trimmed, as shown in FIG. 16. Trimming of the gate spacer layers 41, 49 and the first liner layer 95A may be performed by an isotropic etch operation that does not substantially attack the capping layers 97 of the second hybrid fins 94. In some embodiments, the first liner layer 95A is not trimmed, such that the capping layer 97 is covered by the first liner layer 95A. In some embodiments, following trimming of the gate spacer layers 41, 49, upper surfaces of the gate spacer layers 41, 49 are at a level that is higher than (e.g., more distal the substrate 110 than) the upper surface of the capping layer 97, or are at a level that is level with, or substantially level with, the upper surface of the capping layer 97.

Following trimming of the gate spacer layers 41, 49 and the first liner layer 95A, and with the hard mask layer 29, the replacement hard mask layer 29R and the remaining portions of the dummy gate layers 45 exposed, another etching operation is performed that removes the remaining portions of the dummy gate layers 45, the hard mask layer 29, and the replacement hard mask layer 29R, resulting in the structure shown in FIG. 16. At this intermediate stage, the dummy gate layers 45 may be completely removed, as may be the hard mask layer 29 and the replacement hard mask layer 29R.

In FIG. 17, the nanostructures 24 are then removed to release the nanostructures 22. After the nanostructures 24 are removed, the nanostructures 22 form a plurality of nanosheets that extend horizontally (e.g., parallel to a major upper surface of the substrate 110; e.g., in the X-Y plane). The nanosheets may be collectively referred to as the channels 22 of the nanostructure devices formed.

In some embodiments, the dummy gate dielectric 44 is removed completely, so as to expose the nanostructures 22, 24. The nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Following removal of the nanostructures 24, the upper surface of the capping layer 87 in the gate region may be level with, or substantially level with, the upper surface of the uppermost channels 22, as shown in FIG. 17. In some embodiments, the upper surface of the capping layer 87 in the gate region is not level with the upper surface of the uppermost channels 22. For example, the top of the capping layer 87 may be higher than or lower than the upper surface of the uppermost channels 22.

Figure 18:
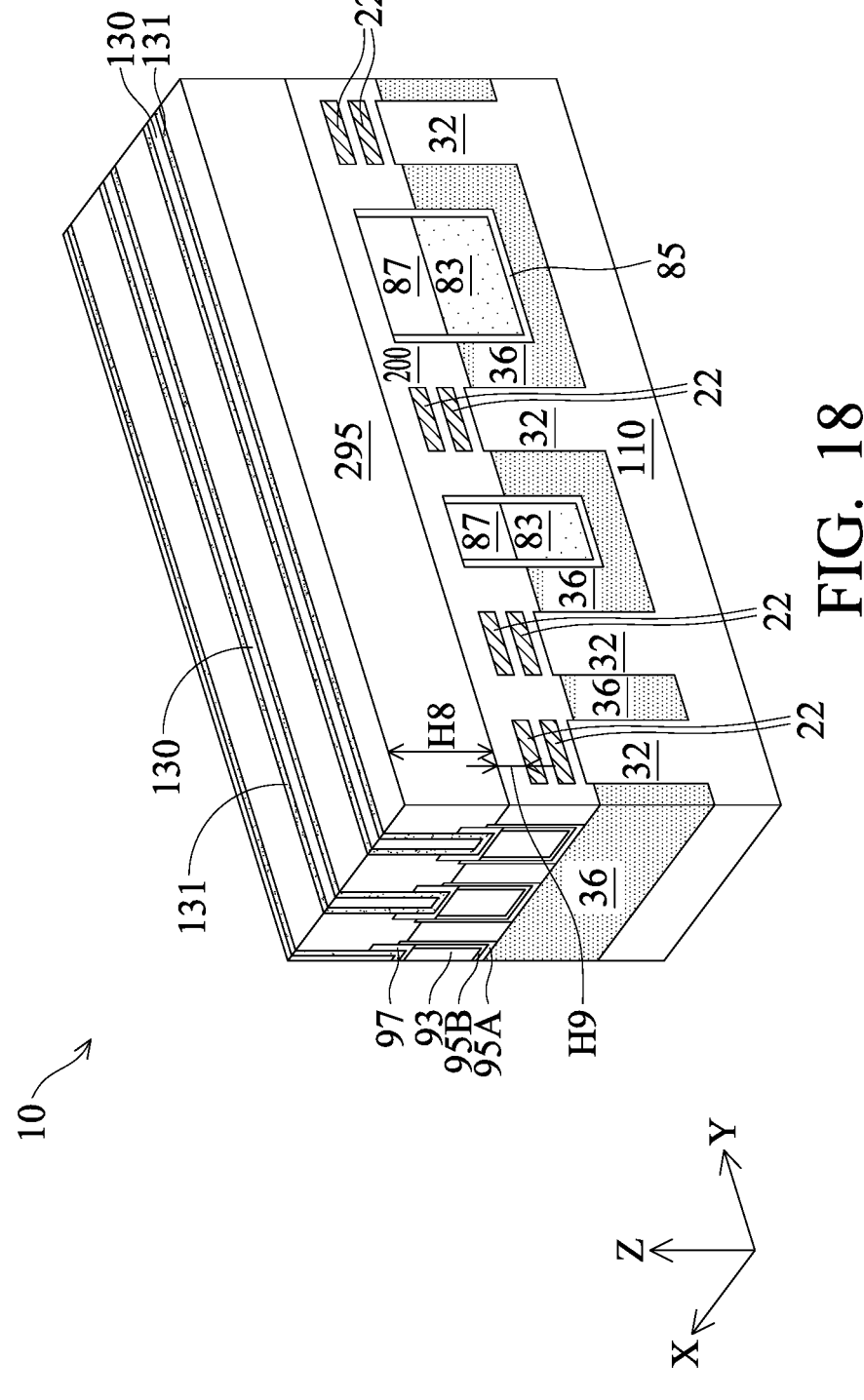

In FIG. 18, replacement gates 200 are formed, corresponding to act 1600 of FIG. 21. FIG. 20 is a detailed view of the replacement gate 200 along the Y-Z plane. Because no second hybrid fins 94 are present in the gate region 170 (e.g., between neighboring stacks of the channels 22, or between the channels 22 and the first hybrid fins 84), space is increased, which reduces defects when depositing the materials of the gate structure 200.

The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 20, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 20, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses $HfCl_4$ and/or $H_2O$ as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A-20E.

With further reference to FIG. 20, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of WCIs, followed by an Ar purge, followed by a second pulse of $O_2$, followed by another Ar purge. The high-k capping layer is removed to increase gate fill window for further multiple threshold voltage tuning by metal gate patterning.

Further in FIG. 20, after forming the second IL 240 and removing the high-k capping layer, the work function barrier layer 700 is optionally formed on the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 20 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between neighboring channels 22A, 22B.

Further to FIG. 18, following formation of the gate structures 200, a capping layer 295, which may be referred to as a self-aligned capping (SAC) layer 295 or mask layer 295, is formed. The SAC layer 295 may be formed of a dielectric material by a suitable deposition process. The dielectric material of the SAC layer 295 may include SiO, SiN, SiC, SiOCN, SiOC, SiCN, AlO, AlON, ZrSi, ZrO, ZrN, ZrAlO, LaO, HfO, HfSi, YO, TiO, TaO, TaCN, ZnO, a combination thereof, or the like. The SAC layer 295 may be formed by CVD, ALD, or another suitable process. The SAC layer 295 protects the underlying gate structure 200 during formation of the source/drain contacts 120 in subsequent operations.

As shown in FIG. 18, a bottom (e.g., surface most proximal the substrate 110) of the SAC layer 295 may be at a level that is level with, substantially level with, or higher than the top of the first liner layer 95A.

In some embodiments, height H8 in the Z-axis direction of the SAC layer 295 may be in a range of about 5 nm to about 40 nm. In some embodiments, height H9 of the gate structure 200 between the top surface of the uppermost channel 22 and the SAC layer 295 may be in a range of about 5 nm to about 40 nm.

Figure 19:
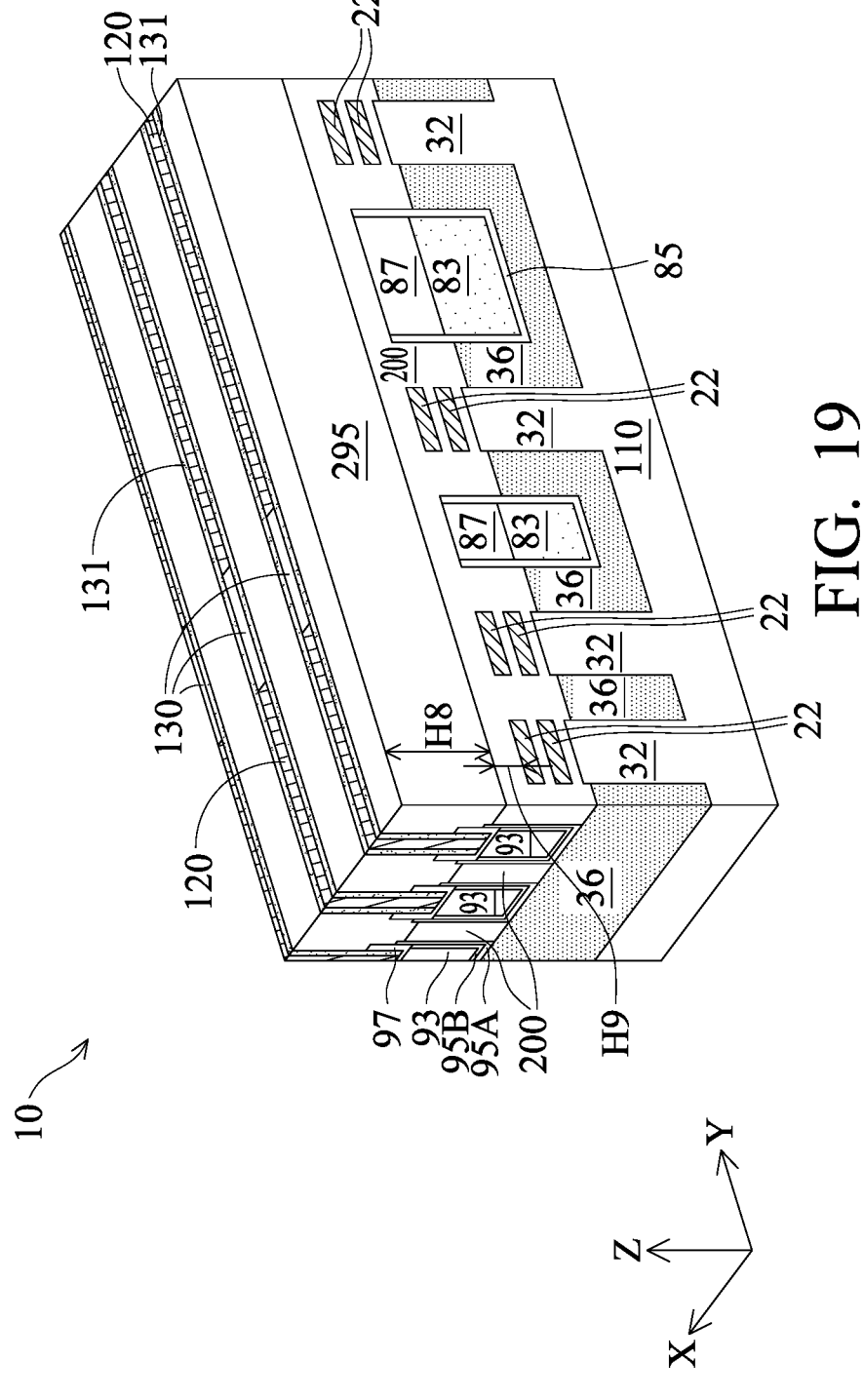

In FIG. 19, the source/drain contacts 120 are formed. In some embodiments, one or more masks are formed over the ILD 130, the CESL 131 and the SAC layer 295, and exposed portions of the ILD 130 are etched through the masks to form openings in the ILD 130. The source/drain contacts

120 are then formed in the openings by a suitable deposition operation, such as a PVD, a CVD, an ALD or other appropriate deposition operation. In some embodiments, portions of the CESL 131 exposed by the openings are trimmed prior to forming the source/drain contacts 120 to increase space for depositing the material of the source/drain contacts 120.

The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. In some embodiments, one or more barrier layers (not shown), such as SiN or TiN, are deposited prior to depositing the source/drain contacts 120, which may prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may include nickel, cobalt, titanium, tantalum, platinum, tungsten, other noble metals, other refractory metals, rare earth metals or their alloys. In some embodiments, thickness of the silicide layer 118 (in the Z-axis direction) is in a range of about 0.5 nm to about 5 nm. In some embodiments, height of the source/drain contacts 120 may be in a range of about 1 nm to about 50 nm.

Embodiments may provide advantages. The first hybrid fins 84 are formed between stacks of the channel layers having larger spacing therebetween, and extend through both the metal gate (MG) region and the source/drain epitaxial regions, which aids in formation of nanostructure devices that are separated by large distances. The second hybrid fins 94 are formed between the source/drain epitaxial regions 82 but not in the metal gate regions. The second hybrid fins 94 are formed prior to formation of the source/drain epitaxial regions 82 to prevent merging of adjacent source/drain epitaxial regions 82. Because the second hybrid fins are not formed in the metal gate regions, space for forming the gate structures 200 is increased, which reduces defects and improves yield.

In accordance with at least one embodiment, a device includes a substrate, a first gate structure, a second gate structure, a first hybrid fin, a second hybrid fin, a first sidewall and a second sidewall. The first gate structure is over and surrounds a first vertical stack of nanostructures. The second gate structure is over and surrounds a second vertical stack of nanostructures. The second gate structure and the first gate structure extend along a first direction, and are laterally separated from each other in a second direction, the second direction being substantially perpendicular to the first direction. The first hybrid fin extends through and under the first gate structure and the second gate structure, the extending being along the second direction. The second hybrid fin is between the first gate structure and the second gate structure. The second hybrid fin has: a first sidewall that abuts the first gate structure; and a second sidewall that abuts the second gate structure.

In accordance with at least one embodiment, a device includes a substrate, a first vertical stack of nanostructures, a second vertical stack of nanostructures, a gate structure, a first source/drain region, a second source/drain region, a first hybrid fin, a second hybrid fin, and a third hybrid fin. The first vertical stack of nanostructures is over the substrate. The second vertical stack of nanostructures is offset from the first vertical stack in a first direction. The gate structure is over and wraps around the first vertical stack of nanostructures. The first source/drain region abuts the first vertical stack of nanostructures in a second direction, the second direction being substantially perpendicular to the first direction. The second source/drain region abuts the second vertical stack of nanostructures in the second direction. The first hybrid fin is between the first vertical stack and the second vertical stack, and extends in the second direction. The second hybrid fin is between the first source/drain region and the first hybrid fin. The third hybrid fin is between the second source/drain region and the first hybrid fin.

In accordance with at least one embodiment, a method includes: forming an isolation layer over and between vertical stacks on a substrate; forming a first hybrid fin on the isolation layer between the vertical stacks; forming sacrificial gate structures over the vertical stacks; forming second hybrid fins between the vertical stacks and the first hybrid fin, the second hybrid fins laterally abutting the sacrificial gate structures; forming openings by recessing portions of the vertical stacks exposed by the sacrificial gate structures; and forming source/drain regions in the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first gate structure over and surrounding a first vertical stack of nanostructures;
a second gate structure over and surrounding a second vertical stack of nanostructures, wherein the second gate structure and the first gate structure extend along a first direction, and are laterally separated from each other in a second direction, the second direction being substantially perpendicular to the first direction;
a first hybrid fin extending through and under the first gate structure and the second gate structure, the extending being along the second direction; and
a second hybrid fin between the first gate structure and the second gate structure, the second hybrid fin having:
a first sidewall that abuts the first gate structure; and
a second sidewall that abuts the second gate structure, wherein the second hybrid fin is a separate layer from the first hybrid fin.

2. The device of claim 1, further comprising:
an isolation structure extending along the second direction;
wherein lateral sidewalls of the first hybrid fin abut the isolation structure.

3. The device of claim 2, wherein the first hybrid fin extends vertically to have an upper surface substantially level with an upper surface of uppermost nanostructures of the first and second vertical stacks of nanostructures.

4. The device of claim 1, wherein the second hybrid fin extends vertically to have an upper surface above an upper surface of uppermost nanostructures of the first and second vertical stacks of nanostructures.

5. The device of claim 1, wherein the second hybrid fin comprises:
a first liner layer;
a second liner layer on the first liner layer;
a core layer on the second liner layer; and
a capping layer on the core layer.

6. The device of claim 5, wherein the capping layer contacts the core layer, the first liner layer, and the second liner layer.

7. A device comprising:
a substrate;
a first vertical stack of nanostructures over the substrate;
a second vertical stack of nanostructures offset from the first vertical stack in a first direction;
a gate structure over and wrapping around the first vertical stack of nanostructures;
a first source/drain region abutting the first vertical stack of nanostructures in a second direction, the second direction being substantially perpendicular to the first direction;
a second source/drain region abutting the second vertical stack of nanostructures in the second direction;
a first hybrid fin between the first vertical stack and the second vertical stack, the first hybrid fin extending in the second direction;
a first second hybrid fin between the first source/drain region and the first hybrid fin; and
a second second hybrid fin between the second source/drain region and the first hybrid fin, wherein a bottom of the first hybrid fin is vertically offset from bottoms of the second and second second hybrid fins.

8. The device of claim 7, further comprising:
an isolation structure between the first vertical stack and the second vertical stack, the isolation structure extending in the second direction;
wherein the isolation structure abuts lateral sidewalls of the first hybrid fin, and abuts bottoms of the first second and second second hybrid fins.

9. The device of claim 7, further comprising:
a source/drain contact in contact with the first source/drain region and the second source/drain region.

10. The device of claim 9, further comprising:
a source/drain contact isolation structure extending through the source/drain contact, the source/drain contact isolation structure being in contact with the first, first second and second second hybrid fins.

11. The device of claim 7, wherein:
the first second hybrid fin contacts the first source/drain region; and
the second second hybrid fin contacts the second source/drain region.

12. The device of claim 7, wherein the first hybrid fin is spaced from the first source/drain region by a distance in a range of about 20 nanometers to about 30 nanometers.

13. A device, comprising:
a substrate;
a first vertical stack of nanostructures over the substrate;
a second vertical stack of nanostructures over the substrate and offset from the first vertical stack in a first direction;
an isolation structure between the first vertical stack of nanostructures and the second vertical stack of nanostructures;
a first gate structure over and wrapping around the first vertical stack of nanostructures;
a second gate structure over and wrapping around the second vertical stack of nanostructures;

a first hybrid fin extending along a second direction, the second direction being substantially perpendicular to the first direction, between the first and second vertical stacks, wherein the first hybrid fin extends under and through the first and second gate structures, the first hybrid fin at least partially in the isolation structure;

a first second hybrid fin disposed between the first vertical stack and the first hybrid fin, the first second hybrid fin extending along the first direction and not extending under the first gate structure, the first second hybrid fin over the isolation structure;

a second second hybrid fin disposed between the second vertical stack and the first hybrid fin, the second second hybrid fin extending along the first direction and not extending under the second gate structure, the second second hybrid fin over the isolation structure, the first second hybrid fin and the second second hybrid fin being a separate layer from the first hybrid fin.

14. The device of claim 13, wherein the first hybrid fin comprises:

a liner layer over an isolation structure;

a core layer over the liner layer;

a capping layer over the core layer.

15. The device of claim 14, wherein the capping layer contacts the liner layer and the core layer.

16. The device of claim 13, wherein each of the first second and second second hybrid fins comprises:

a first liner layer;

a second liner layer over the first liner layer;

a core layer over the second liner layer;

a capping layer over the core layer.

17. The device of claim 16, wherein the capping layer contacts the core layer, the first liner layer, and the second liner layer.

18. The device of claim 13, wherein the first hybrid fin extends vertically below the first second and second second hybrid fins.

19. The device of claim 13, further comprising:

source/drain regions adjacent to the first and second vertical stacks of nanostructures along the second direction;

wherein the first second and second second hybrid fins are disposed between the source/drain regions and the first hybrid fin.

20. The device of claim 7, wherein the first second hybrid fin and the second second hybrid fin are each a different layer from the first hybrid fin.

* * * * *